(12) United States Patent
Kanamori

(10) Patent No.: US 6,317,360 B1
(45) Date of Patent: Nov. 13, 2001

(54) FLASH MEMORY AND METHODS OF WRITING AND ERASING THE SAME AS WELL AS A METHOD OF FORMING THE SAME

(75) Inventor: Kohji Kanamori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,722

(22) Filed: Sep. 1, 1999

(30) Foreign Application Priority Data

Sep. 1, 1998 (JP) .................................................. 10-247416

(51) Int. Cl.$^7$ .................................................. G11C 16/04
(52) U.S. Cl. .............................. 365/185.01; 365/185.29; 365/185.33; 257/315
(58) Field of Search ........................ 365/185.01, 185.18, 365/185.29, 185.33; 257/314, 315

(56) References Cited

U.S. PATENT DOCUMENTS

| | | | |
|---|---|---|---|
| 4,975,384 | * 12/1990 | Baglee | 438/285 |
| 5,146,426 | * 9/1992 | Mukherjee et al. | 365/185 |
| 6,002,151 | * 12/1999 | Liu et al. | 257/316 |

FOREIGN PATENT DOCUMENTS

| | | |
|---|---|---|
| 60-200573 | 10/1985 | (JP) . |
| 1-115164 | 5/1989 | (JP) . |
| 4-221857 | 8/1992 | (JP) . |
| 4-267374 | 9/1992 | (JP) . |
| 6-85274 | 9/1992 | (JP) . |
| 5-82798 | 4/1993 | (JP) . |
| 5-299663 | 11/1993 | (JP) . |
| 10-107230 | 4/1998 | (JP) . |
| 10-116925 | 5/1998 | (JP) . |

\* cited by examiner

Primary Examiner—Huan Hoang
(74) Attorney, Agent, or Firm—Young & Thompson

(57) ABSTRACT

A flash memory is provided on a semiconductor substrate. A trench with corners is provided on a surface of the semiconductor substrate. A gate insulation film is provided on a surface within the trench. A floating gate is buried within the trench through the gate insulation film. A control gate is provided isolated from the floating gate, and also is characterized in that at the corners of the trench, corners of the floating gate face through the gate insulation film to edges of the semiconductor substrate, and if the control gate is made low potential whilst the semiconductor substrate is made high potential, then electrons are extracted from the corners of the floating gate.

7 Claims, 45 Drawing Sheets

(a)

(b)

Program (2) (3)

(a)

Erase (2) (3)

(b)

(a)

(a')

(a)

(a')

(a)

(b)

(c)

(a)

(b)

(c)

(a)

(b)

(a)

(b)

(a)

(b)

(a)

(b)

(a)

(b)

(a)

(c)

(a')

(a)

(b)

(a)

(b)

(a)

(b)

FLASH MEMORY AND METHODS OF WRITING AND ERASING THE SAME AS WELL AS A METHOD OF FORMING THE SAME

BACKGROUND OF THE INVENTION

The present invention relates to a flash memory as a non-volatile semiconductor memory device and more particularly to a novel structure thereof and a method of forming the same and methods of writing and erasing data.

DESCRIPTION OF THE RELATED ART

Conventionally, a flash memory capable of electrically writing and erasing informations has been known as a non-volatile semiconductor memory device.

FIG. 47 is a cross sectional view illustrative of a conventional structure of the flash memory. On a surface of a p-type silicon substrate 101, source and drain regions 105 and 106 of n-type impurity diffusion layers. A floating gate 103 is formed via a gate oxide film 102 thereon and further a control gate 104 is laminated thereon.

The data writing and erasing to the flash memory may be carried out as follows.

In the erasure operation, for example, the drain region 106 is made into a floating state whilst the control gate 104 is grounded. The source region 105 is applied with, for example, a high voltage of about 12V. An F-N (Fowler-Nordheim) tunneling current flows through the gate oxide film 102 at overlapping portions between the source region 105 and the floating gate 103. This F-N current extracts electrons from the floating gate 103 for carrying out the erasure.

In the writing operation, the source region 105 is grounded whilst the drain region 106 is applied with, for example, 7V and the control gate is applied with about 12V to cause an avalanche phenomenon in the vicinity of the drain region 106 under the floating gate edge, so that degenerated hot electrons are injected through the gate oxide film 102 in the drain side to the floating gate 103 from the silicon substrate 1 for carrying out the data write.

In reading operations, the source region 105 is grounded, whilst the drain region 106 is applied with, for example, 1V and the control gate is applied with about 3V, so that states "1" and "0" are judged depending upon a current higher than a predetermined value from the drain region 106 to the source region 105, for carrying out the data reading operation. If the electrons are injected into the floating gate, then no current flows between the source and drain. In this case, the written state "1" is read. If electrons are extracted from the floating gate, then a current higher than the predetermined value flows between the source and drain. In this case, the read state "0" is read.

In the above examples, the state of electron extraction from the floating gate is set to be the erasure state whilst the other state of electron injection into the floating gate is set to be the written state. It is, however, possible that a bit-selectable operation is considered to be writing operation and a bit-unselectable operation is considered to be erasing operation. Namely, depending on the structure of the flash memory, the electron extraction may be considered to be writing operation.

For example, in AND-type cells, in FIG. 47 (provided that a plan structure is different), in the write operation, the source region 105 is grounded or floated, whilst the drain region 106 is applied with 5V and the control gate 104 is applied with −9V to cause the F-N tunneling current whereby electrons are extracted from the floating gate. This is considered to be the data writing operation.

In the erasure operation, the source and drain regions 105 and 106 are grounded whilst the control gate 104 is applied with 18V to cause the F-N tunneling current flowing through the gate oxide film 102 between the source-drain channel region 108 and the floating gate 103 whereby electrons are injected into the floating gate. This is considered to be the data erasure operation.

It is necessary for the conventional flash memory to apply high voltage for erasure and writing operations. In order to reduce the voltage level, it may be considered to reduce the thickness of the gate oxide film. However, the reduction in thickness of the gate oxide film causes the gate oxide film to be deteriorated by frequent write and erase operations, whereby a leakage current so called to be stress induced leakage current may flow. This makes it difficult to store charges in the floating gate. It is possible that even application of a low field to the gate oxide film in the reading operation causes disturb-phenomenons or data erasure and data writing. It is no longer possible to keep reliability.

SUMMARY OF THE INVENTION

The present invention was made to solve the above problems. An object thereof is to provide a flash memory operable in low voltage with a high reliability without reduction in thickness of the gate oxide film.

A flash memory in accordance with the present invention is provided on a semiconductor substrate with: a trench with corners provided on a surface of the semiconductor substrate; a gate insulation film provided on a surface within the trench; a floating gate buried within the trench through the gate insulation film; and a control gate provided to be isolated from the floating gate, and also is characterized in that at the corners of the trench, corners of the floating gate face through the gate insulation film to edges of the semiconductor substrate, and if the control gate is made low potential whilst the semiconductor substrate is made high potential, then electrons are extracted from the corners of the floating gate.

In one practicable mode of the flash memory of the present invention, on the semiconductor substrate surface at the top corners of the trench, a thick insulating film is provided for preventing electron injections to the floating gate from the corners of the semiconductor substrate a the top edge of the trench.

In another practicable mode of the flash memory of the present invention, the floating gate is T-shaped with a wider portion than a trench width over the semiconductor substrate surface, and at the top edges of the trench, corners of the floating gate face through the gate insulation film to the edges of the semiconductor substrate, and if the control gate is made high potential whilst the semiconductor substrate is made low potential, then electrons are injected into the floating gate from the semiconductor substrate.

In this case, it is possible that a source region of a shallow impurity diffusion layer is provided on one side of the trench in the semiconductor substrate, whilst a drain region of such a deep impurity diffusion layer as to reach bottom corners of the trench is provided on an opposite side of the trench in the semiconductor substrate, and if the control gate is made low potential whilst the drain region is made high potential, then electrons are extracted from the floating gate to the drain region, and if the control gate is made high potential whilst at least any one of the source and drain regions is made low potential, then electrons are injected into the floating gate.

Alternatively, it is also possible that a drain region of such a deep impurity diffusion layer as to reach bottom corners of the trench is provided on an opposite side of the trench in the semiconductor substrate, whilst a source region of a shallow impurity diffusion layer is provided on one side of the trench and at a position separated from the floating gate, and further a select gate is provided between the floating gate and the source region.

A method of writing and erasing data of a flash memory in accordance with the present invention is characterized in that at least any one of writing and erasing operations is carried out by setting the semiconductor substrate at a high potential and also setting the control gate at a low potential to extract electrons from the floating gate.

In a method of writing and erasing data of a flash memory where corners of the floating gate face through the gate insulation film to the edges of the semiconductor substrate, it is possible that one of writing and erasing operations is carried out by setting the semiconductor substrate at a high potential and also setting the control gate at a low potential to extract electrons from the floating gate, and remaining one of the writing and erasing operations is carried out by setting the semiconductor substrate at a low potential and also setting the control gate at a high potential to inject electrons into the floating gate.

In the mode of providing the select gate, the writing operation is carried out by setting the drain region at a high potential and also setting the control gate at a low potential to extract electrons from the floating gate, and the erasing operation is carried out by setting the drain region at a low potential and also setting the control gate at a high potential to inject electrons into the floating gate, and the reading operation is carried out by giving the select gate a predetermined potential to form a channel on the semiconductor substrate surface under the select gate, so that a current between the source and drain regions is detected.

DESCRIPTIONS OF REFERENCE NUMBERS

Figure 1:
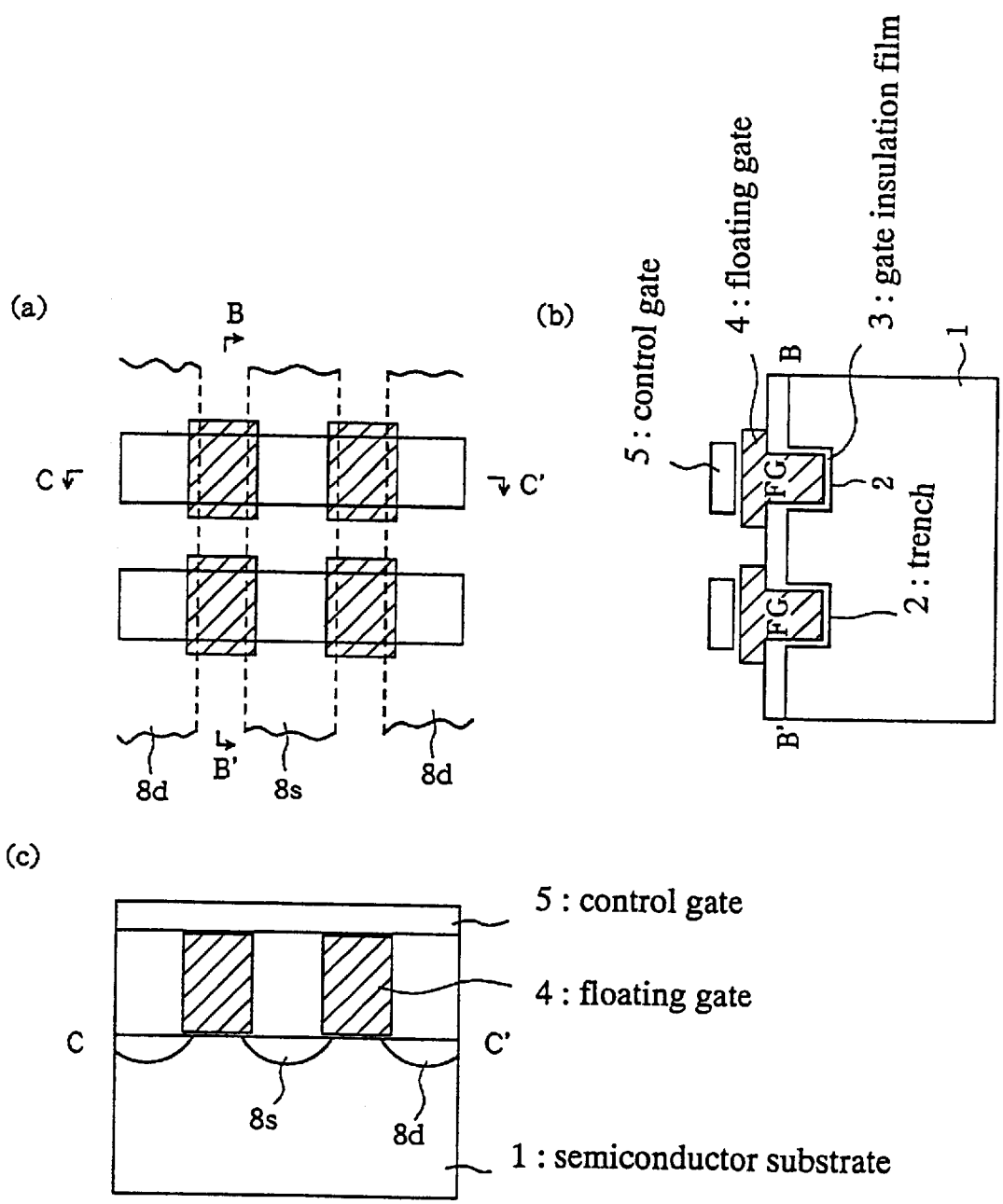
FIG. 1 is a view illustrative of one mode of a flash memory.

1: semiconductor substrate
2: trench
3: gate insulation film
4: floating gate
5: control gate
7: device formation region
8s: source region
8d: drain region
9: insulation film
10: corner
11: corner
12: device isolation film
14: corner
15: corner
16: select gate
18: shallow ion-implantation layer
19: deep ion-implantation layer
21: p-type silicon substrate
22: trench
23: gate oxide film
24: polysilicon
25: polysilicon
26: side all oxide film
27: dummy oxide film
29: silicon oxide film
30: silicon oxide film
31: ONO film
32: silicon oxide film
33: side wall oxide film
34: resist
35: LOCOS oxide film
36: resist

DETAILED DESCRIPTION OF THE PREFERRED EMBODIMENTS

In accordance with the present invention, as shown in FIGS. 2, 9, 12 and 16, a trench is formed in a surface of a semiconductor substrate 1. A gate insulation film is provided on a surface within the trench. A floating gate 4 is buried within the trench. A control gate 5 is provided on an insulation film over the floating gate 4.

In accordance with the present invention, at bottom corners of the trench (in a broken line circle (2) ), the corner of the floating gate faces to the corner of the semiconductor substrate via the gate insulation film. If the floating gate is made low potential whilst the semiconductor substrate is made high potential, then electrons are extracted from the corner of the floating gate via the F-N tunneling current.

The shape of the trench may be cross-sectional shape with such a corner as allowing electron extractions via the F-N tunneling. On the ground of adjustment in angle of the corners and manufacturing processes, rectangle is most preferable.

The depth of the trench may be changed in consideration of the depths of the source region and the drain region formed by the ion-implantation.

The trench may, as described in the below embodiment, be either stripe-shaped which extends a plurality of memory cells or independent in individual memory cell. Convenient one for the manufacturing processes is selected to adjust the structure of the memory cell.

In a broken line circle (3), the semiconductor substrate has a corner. In the modes shown in FIGS. 2 and 9, a thick insulating film is formed on a surface of the semiconductor substrate at a top edge of the trench. No electron injection is made into the floating gate from the corner of the semiconductor substrate.

Figure 12:
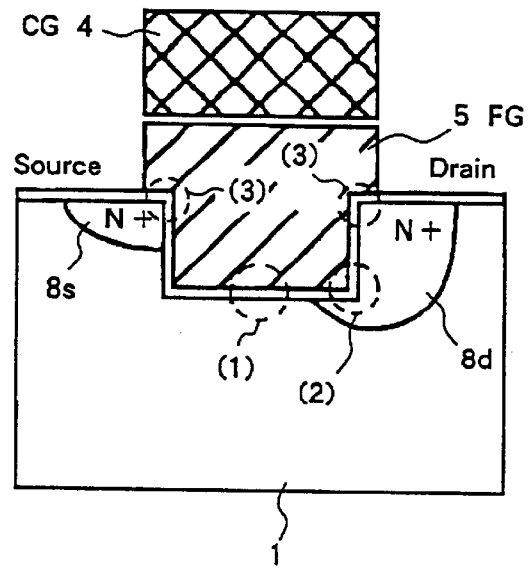
FIG. 12 is an enlarged view illustrative of one mode of a flash memory.
Figure 16:
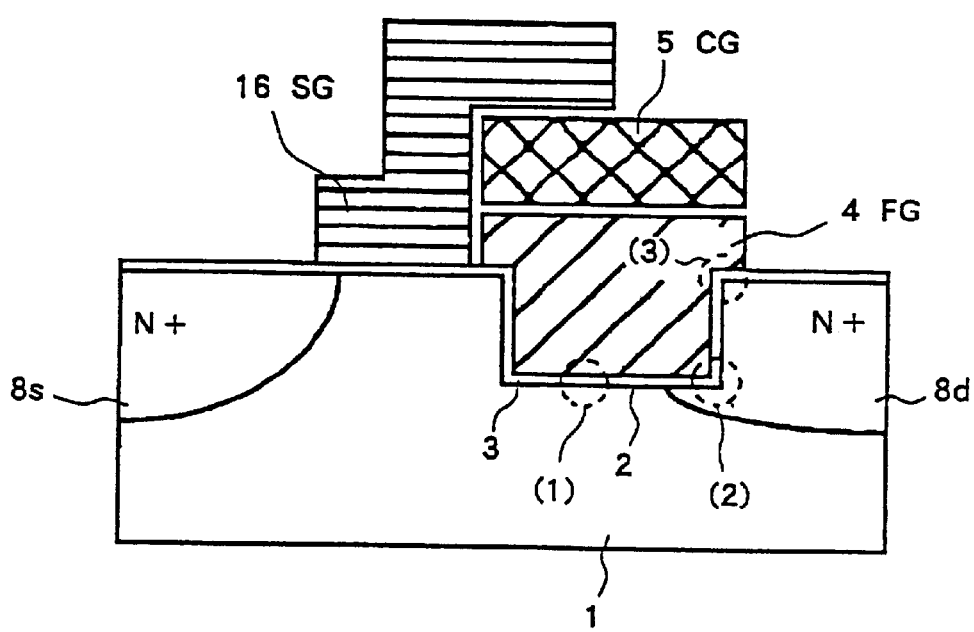
FIG. 16 is an enlarged view illustrative of one mode of a flash memory.

On the other hand, as in the modes shown in FIGS. 12 and 16, the floating gate is T-shaped with a wider portion than a trench width on the semiconductor substrate surface. At the top edge of the trench in the broken line circle (3), the corner of the semiconductor substrate faces the edge of the floating gate through the gate insulation film. If the floating gate is made high potential whilst the semiconductor substrate is made low potential, whereby electrons are injected to the floating gate from the semiconductor substrate.

In the modes shown in FIGS. 12 and 16, the source region and the drain region are positioned at positions (2) and (3) to fix the electron extraction position from the floating gate and the electron injection position.

A memory cell structure in those modes will be described hereafter. The later modes to be described later will accord to the fabrication methods and materials described first unless any specific description is made.

Practicable Mode 1-1

In the flash memory cell structure shown in FIG. 1 ((a) plan view, (b) B–B' cross sectional view, (c) C–C' cross sectional view), on a surface of a semiconductor substrate 1, a trench 2 with a cross sectional rectangle-shape is formed in stripe-shape in a lateral direction in FIG. 1(a). A floating gate 4 is provided on a gate insulation film 3 on a predetermined position of the trench. A control gate 5 as a word line is formed on an insulation film thereon and over the trench in a lateral direction in FIG. 1(a). In a longitudinal direction in FIG. 1(a), as a bit-line, a source region 8s and a drain region 8d are provided.

Figure 2:
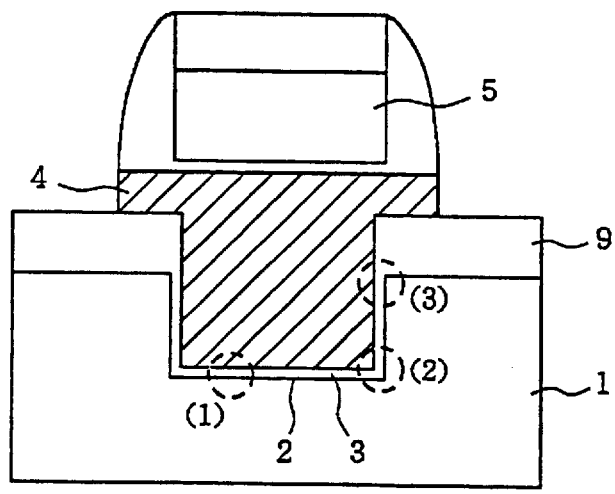
FIG. 2 is an enlarged view illustrative of one mode of a flash memory.
Figure 3:
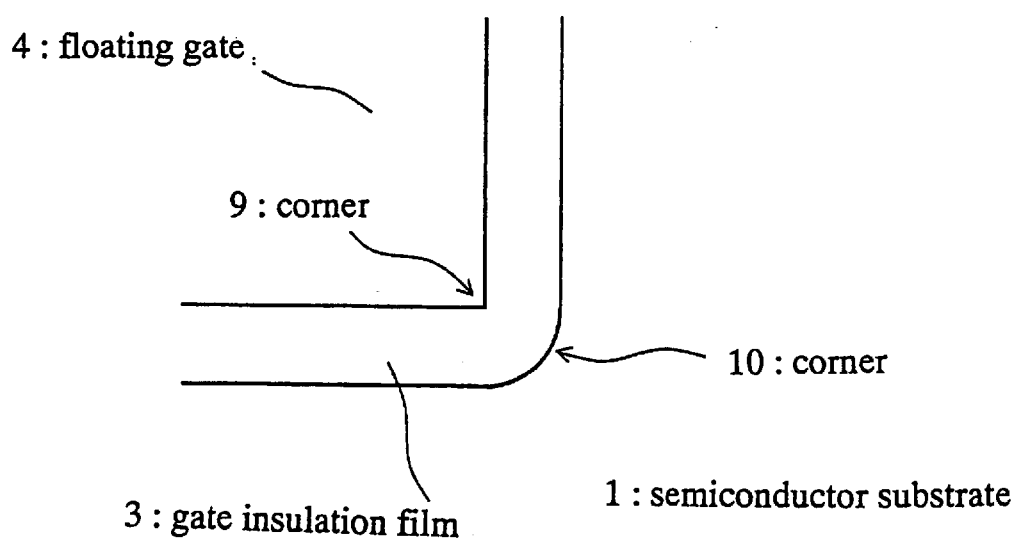
FIG. 3 is an enlarged view illustrative of the bottom corner of the trench in the flash memory.

FIG. 2 illustrates with enlargement of a floating gate in sectional view in correspondence with FIG. 1(b). FIG. 3 is a view with a further enlargement of a broken line circle in FIG. 2. In FIG. 2, side wall insulation films and an insulation film on the control gate are illustrated. However, illustration is eliminated in FIG. 1. As shown in FIGS. 2 and 3, the trench has a corner 10 as shown in a broken line circle (concave corner) The floating gate opposite thereto has a corner 9 (convex corner) In the trench, the gate insulation film 3 is formed with a uniform thickness between the semiconductor substrate 1 and the control gate 4.

The structure will be further described with descriptions of erasure and writing operations of the flash memory.

Figure 4:
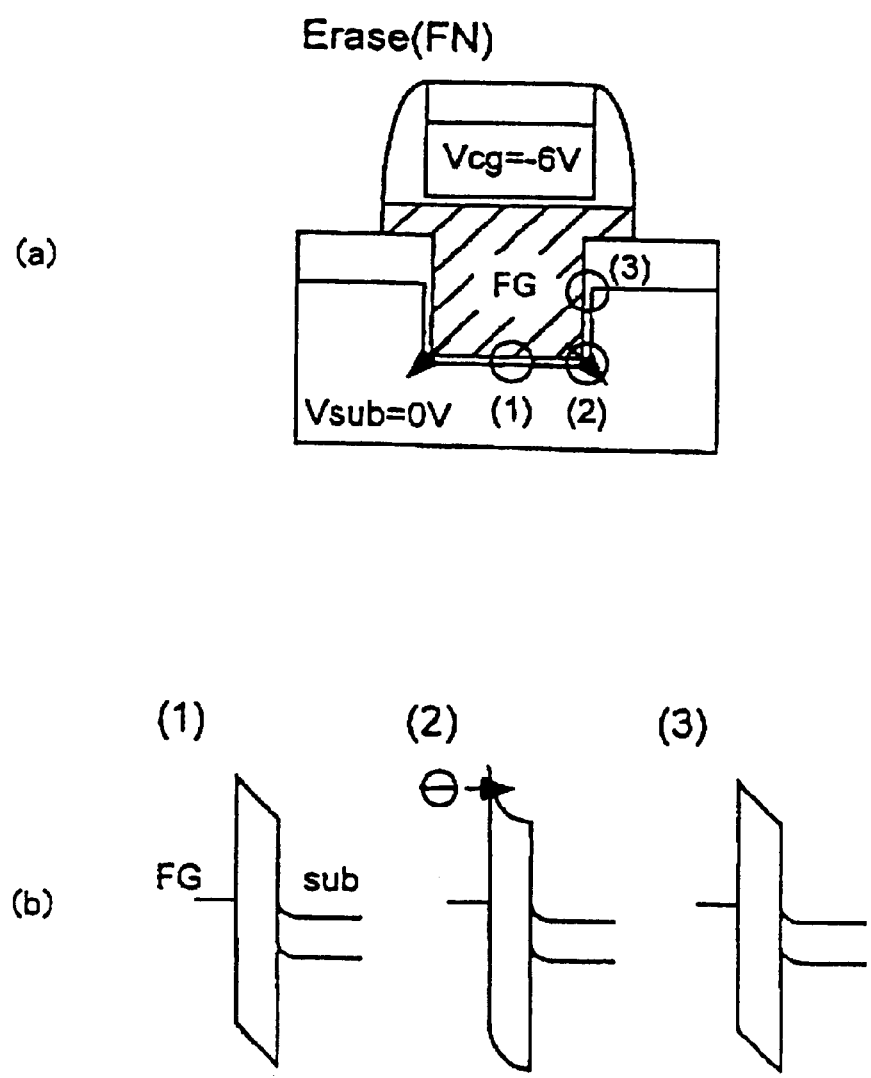
FIG. 4 is a view illustrative of electron extraction from the floating gate in erasing operation in one mode of a flash memory.
Figure 5:
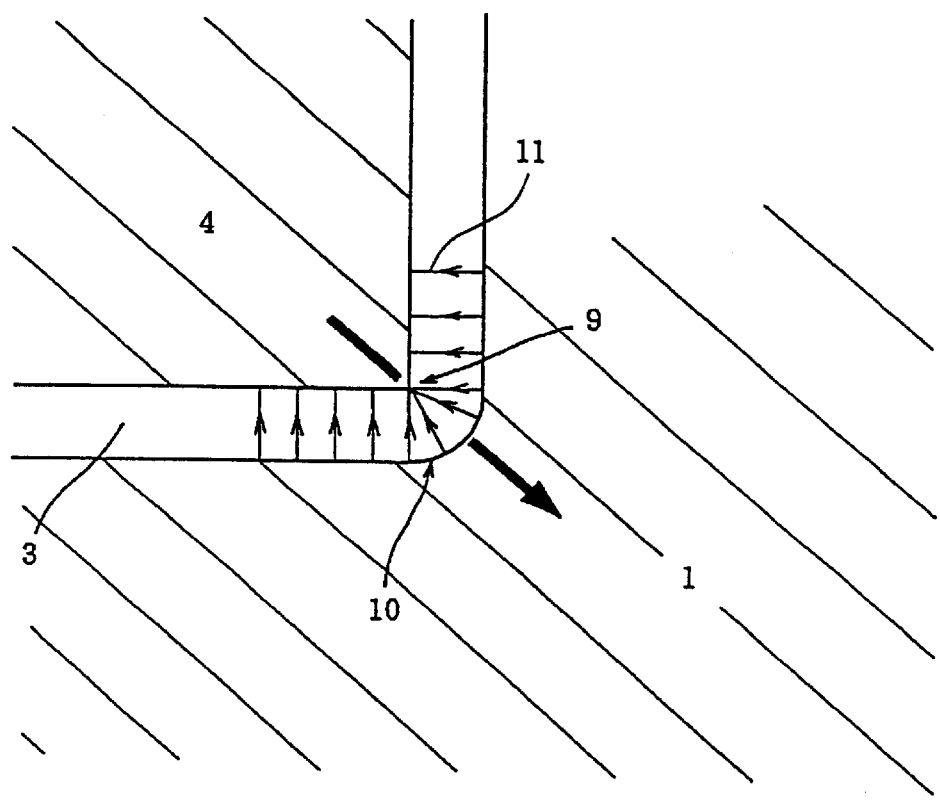
FIG. 5 is a view illustrating that if a semiconductor substrate is made high potential and a floating gate is made low potential, then an F-N tunneling current flows at the bottom corner of the trench in the flash memory.

In accordance with this flash memory, the erasure operation corresponds to the extraction of electrons from the floating gate. As shown in FIG. 4(a), for example, the control gate is applied with −6V, whilst the semiconductor substrate is grounded to drop a potential of the floating gate with reference to the potential of the semiconductor substrate, so that as shown in FIG. 5, fields represented with electric force lines 11 are generated in the insulation film 3 between the floating gate and the semiconductor substrate. As compared to the position where the insulation film is parallel, the field is concentrated at the corner 9 of the floating gate 4, whereby an effective thickness of the insulation film is reduced and electrons are moved from the floating gate 4 to the semiconductor substrate 1 by a tunneling phenomenon through the corner 9. Energy levels at positions of (1), (2), (3) of FIG. 4(a) are shown in FIG. 4(b). At the bottom of the trench of (1), an energy level in the insulation film varies in proportional to a difference in energy between the floating gate (FG) and the semiconductor substrate (Sub). At the trench corner of (2), an effective potential barrier reduces in thickness due to a rapid drop of the energy level in the floating gate side.

Accordingly, the extraction of electrons in the erasing operation appears at the bottom corner of the trench whilst no electron extraction appears at the position where he gate insulation film is in parallel.

Provision of the corner to the floating gate to face the semiconductor substrate through the gate insulation film allows the extraction of electrons at a low voltage.

In the write operation, as shown in FIG. 6(a), the control gate is applied with 10V, whilst the semiconductor substrate is grounded. The drain region is applied with 5V whilst the source region is applied with 0V. hot electrons are injected to the floating gate through the gate insulation film from the channel region between the source and drain regions.

As shown in FIG. 6(b), at (1) positioned at the trench bottom, the energy levels corresponding to the positions (1), (2), (3) of FIG. 2(a), are proportionally decreased from the semiconductor substrate to the floating gate. At the bottom corner (2) of the trench, a drop of the energy level is gentle in the semiconductor substrate side (Sub) and the effective potential barrier is thick. Namely, the field is relaxed at the corner no electron injection appears at the corner in the write operation.

Figure 7:
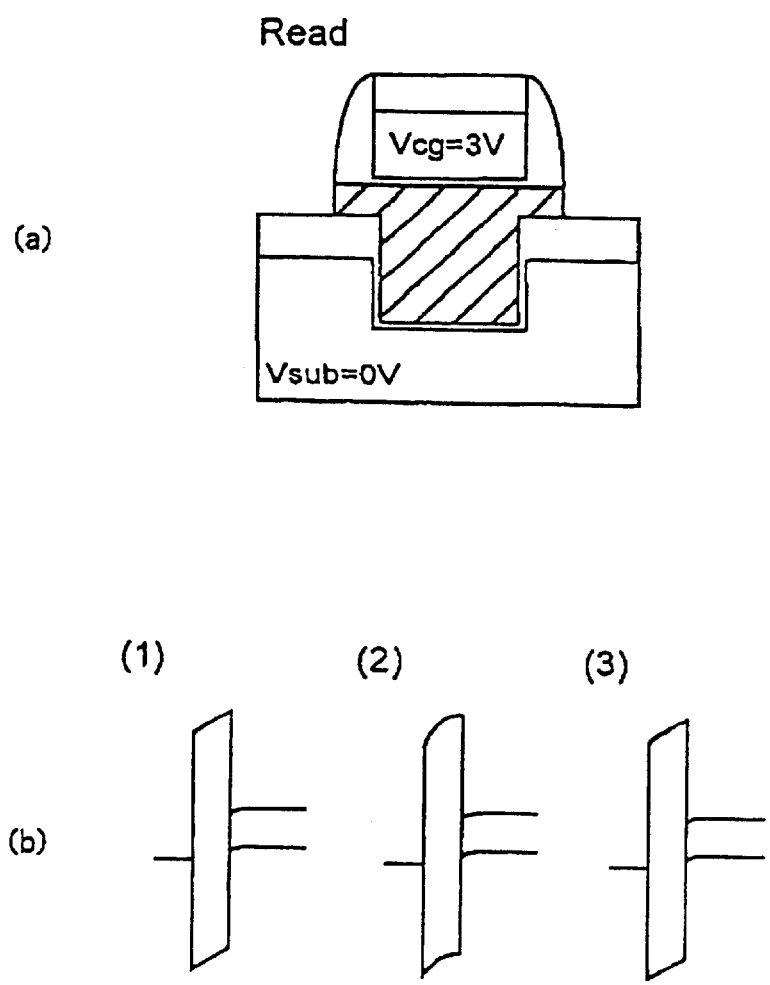
FIG. 7 is a view illustrative of a read operation in one mode of a flash memory.

In the reading operation, as shown in FIG. 7(a), for example, the control gate is applied with 3V, whilst the semiconductor substrate is grounded. A voltage of about 1V is applied across the source-drain. The write state or the erasing state depends upon whether or not the current value between the source and drain is above the predetermined value.

Figure 6:
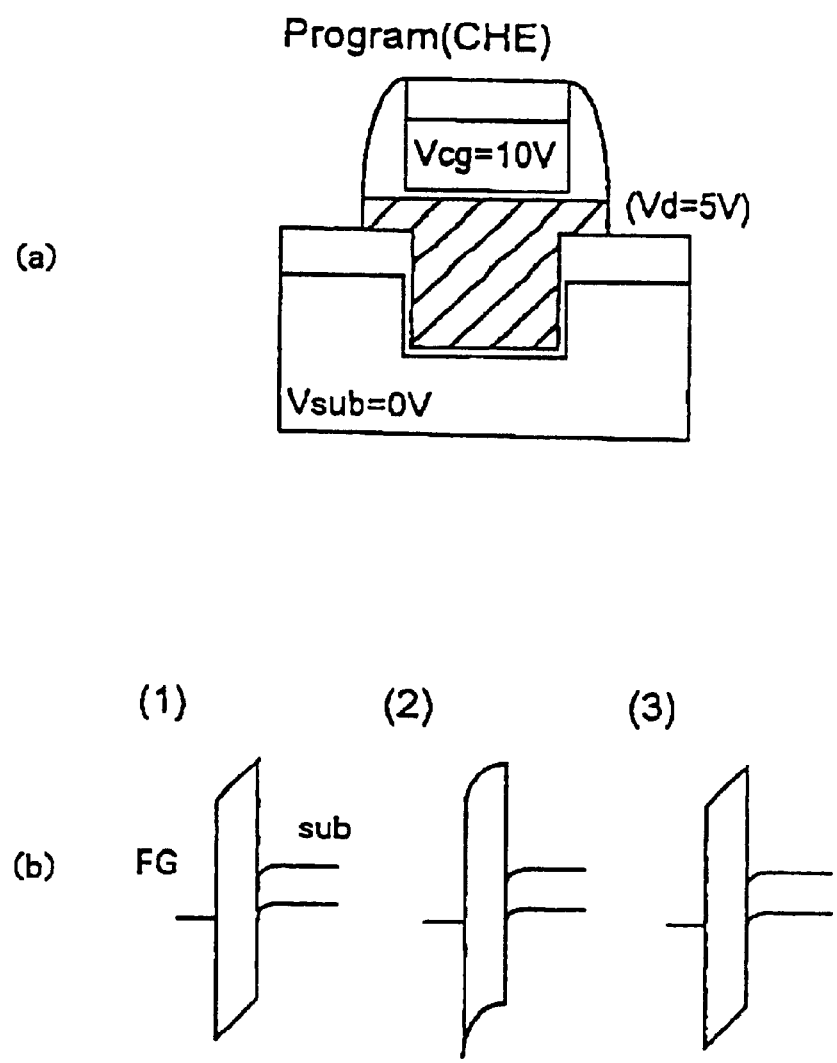
FIG. 6 is a view illustrative of a write operation in one mode of a flash memory.

At the position (3) of FIG. 2, the corner exists on the surface of the semiconductor substrate 1. The thick insulation film 9 is also provided on the surface thereof. No corner (no concave corner) is formed in the opposite side or the floating gate side. As shown in FIG. 6, even if the potential of the floating gate side is risen over the semiconductor substrate side, no field concentration appears, whereby no electron injection to the floating gate appears. Namely, the thick insulation film has a sufficient thickness for causing no electron movement through the insulation film.

Without making the gate insulation film so thin as raising SILC problem, it is possible that electrons are extracted from the floating gate at a low voltage. It is possible to reduce the erasing voltage with keeping the reliability without any disturbance to data in the reading operation.

The gate insulation film 3 is needed to be so thick as causing no SILC, but preferably thin in view of the reduction of the voltage, for example, normally about 80–300 angstroms, preferably 90–200 angstroms, most preferably 100–150 angstroms. SILC is observed at less than 80 angstroms.

In FIG. 3, the corner 9 of the floating gate is sharpen at right angle, but there is no problem it is rounded so as to cause the field concentration. Normally, if a curvature radius is not more than 30% of the thickness of the gate insulation film (flat portion), a sufficient field concentration is caused, preferably not more than 20%, more preferably not more than 10%. For example, if the gate insulation film is 100 angstroms and the curvature of the corner of the floating gate is in 10 angstroms to 30 angstroms, the sufficient field concentration is caused.

It is preferable that the corner 10 of the trench in the semiconductor substrate side is positioned at a uniform distance from the corner, namely the thickness of the gate insulation film is uniform at the corner as the parallel portion.

In the most preferable mode, the corner 10 is a quarter circle with a center position at the corner 9. If the variation in thickness is in 10% from one quarter circle, preferably within 50%, then the object of the present invention can be achieved under the normal conditions in use.

An excessive reduction in thickness of the gate insulation film at the corner is likely to cause the disturb phenomenon. An excessive increase in thickness makes it difficult to cause electron extraction via the F-N tunnel phenomenon and it is difficult to reduce the voltage.

The cross sectional shape of the trench 2 is usually rectangle as shown in FIG. 2. The angle of the corner 9 is 90 degrees. If the corner 9 has an acute angle of less than 90 degrees, it is more easy to cause the field concentration. In view of convenience of manufacturing, 90 degrees are preferable. In case of an obtuse angle, the field concentration is relaxed. This is not preferable. In either cases, within 10% (preferably 5%) from 90 degrees, the manufacturing is easy and no excessive relaxation of the field concentration is cased in the obtuse angle.

As the semiconductor substrate used in accordance with the present invention, a silicon substrate is preferable. A polysilicon is preferable as a material for the floating gate. A silicon oxide film or a silicon nitride film is preferable as the gate insulation film. In accordance with the present techniques, those materials are used to obtain best characteristics.

In accordance with the present invention, a normal etching technique such as an anisotropic etching may be used to form the trench in the semiconductor substrate. The gate insulation film may be formed by deposition of the insulation film uniformly by use of CVD.

If the semiconductor substrate is the silicon substrate, then it is possible that the substrate formed with the trench is then subjected to a thermal oxidation to form thermal oxide films with a predetermined thickness. If CVD method is used, it is possible that the silicon oxide film is formed to have a desired thickness to the gate insulation film. It is also possible that the silicon oxide film with a thinner thickness than the desired thickness is formed by the CVD and subsequently an additional oxidation process is carried out to increase the thickness up to the desired thickness. It is possible to carry out a treatment for improvement in quality of the film if any. Typical formation methods of the gate insulation film are described in the following (a), (b), (c), and (d).

(a) the silicon oxide film is formed which has a predetermined thickness by use of CVD method. The available CVD methods capable of forming a high density film are preferable. Normal low pressure CVD (LPCVD) may be used. However, HTO (High Temperature CVD Oxidation; high temperature CVD) at about 800 with use of a mixture gas of SiH4 and O2 as source gases.

(b) CVD method (any methods are available) is used to form a silicon oxide film with a predetermined thickness before an anneal is carried out at 950 100 to increase the density of the film. The method of anneal may be a method of treating a large number of substrates in an electric furnace or an RTA method (rapid thermal annealing) in place of the normal anneal.

(c) CVD method (any methods are available) is used to form a silicon oxide film with a thickness in about 70% to less than 100% (preferably 80–98%) of the predetermined thickness before a heat treatment at 950 100 in an oxygen atmosphere to form a thermal oxidation film to increase the thickness to the predetermined thickness. Either a dry oxidation or a wet oxidation is available. In pace of the normal thermal oxidation method, an RTO method (rapid thermal oxidation) is available.

(d) CVD method (any methods are available) is used to form a silicon oxide film with a thickness in about 70% to less than 100% (preferably 80–98%) of the predetermined thickness before a heat treatment at 950 100 in an oxygen atmosphere which contains a nitrogen compound gas such as NH3 or N2O and oxygen to form a nitridation oxidation film to increase the thickness to the predetermined thickness. An RTN method (rapid thermal nitridation) as the RTO in the oxygen atmosphere which contains a nitrogen compound gas such as NH3 or N2O and oxygen is available.

In the formation method for the gate insulation film, if the formation method with a reaction of silicon in substrate is used, even the corner (concave corner) of the trench of the silicon substrate is sharpen at right angle, then a rounded corner as he corner 10 in FIG. 3 is likely to be formed with the reaction so that the distance from the confronting floating gate corner 9 is likely to be uniform. If the deposition method is free from the reaction of the substrate material, the trench is so formed that the corner 10 is rounded.

After the gate insulation film is deposited, for example, a polysilicon is deposited and then patterned to form a floating gate.

In this practicable mode, no electron injection to the floating gate from the semiconductor substrate is made, for which reason a thick insulation film is formed on the semiconductor substrate at a proper timing.

This mode is advantageous in that the stack structure over the semiconductor substrate surface is not made thick.

Practicable Mode 1-2

Figure 8:
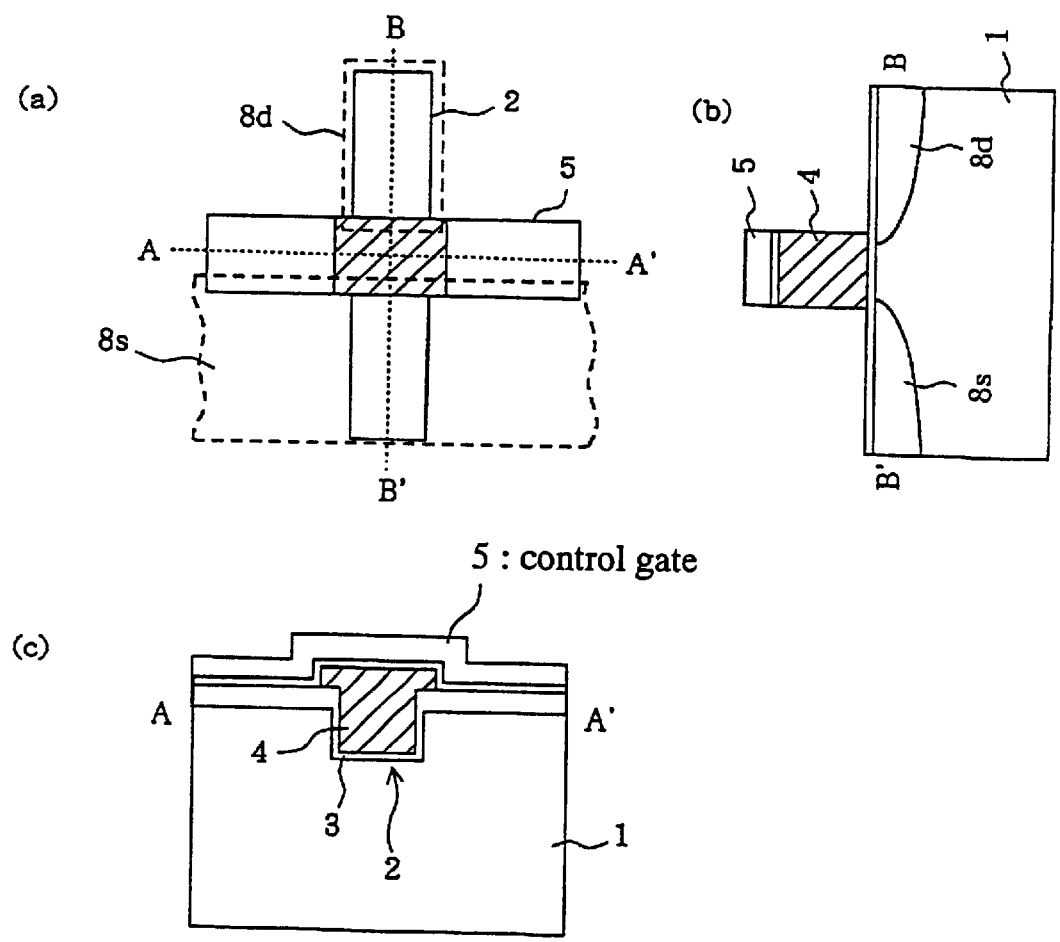
FIG. 8 is a view illustrative of one mode of a flash memory.

In the different flash memory cell structure is shown in FIG. 8 ((a) plan view, (b) B–B' cross sectional view, (c) A–A' cross sectional view), on a surface of a semiconductor substrate 1, a trench 2 with a cross sectional rectangle-shape is formed in a longitudinal direction of FIG. 8(a). A floating gate 4 is provided on a gate insulation film 3 on a predetermined position of the trench. A control gate 5 as a word line is formed on an insulation film thereon in a lateral direction in FIG. 8(a). Differently from the practicable model, the trench extends across the control gate at right angle. In the lateral direction of FIG. 1(a), the source region 8s is continuously provided whilst the drain region 8d is independently provided. Normally, the source region is used as a ground line whilst the drain region is connected to a bit line.

Figure 9:
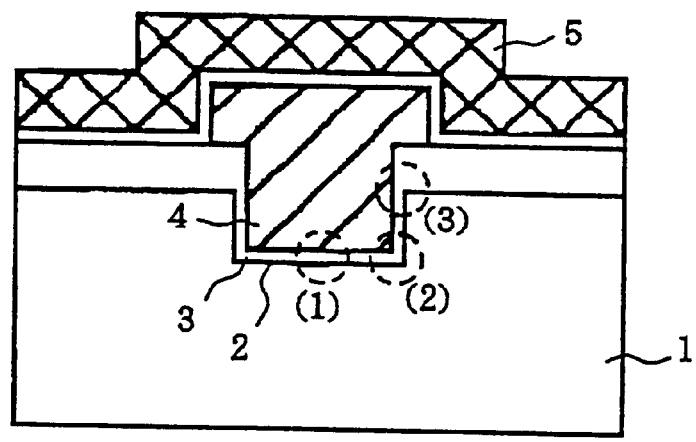
FIG. 9 is an enlarged view illustrative of one mode of a flash memory.

FIG. 9 is a view illustrative with an enlargement of the floating gate in cross section in correspondence with FIG. 8 (C). The trench 2, the gate insulation film 3, and the floating gate 4 are the same as in the practicable model in the shape and position. In the trench, the gate insulation film 3 with a uniform thickness is formed between the semiconductor substrate 1 and the control gate 4.

Figure 10:
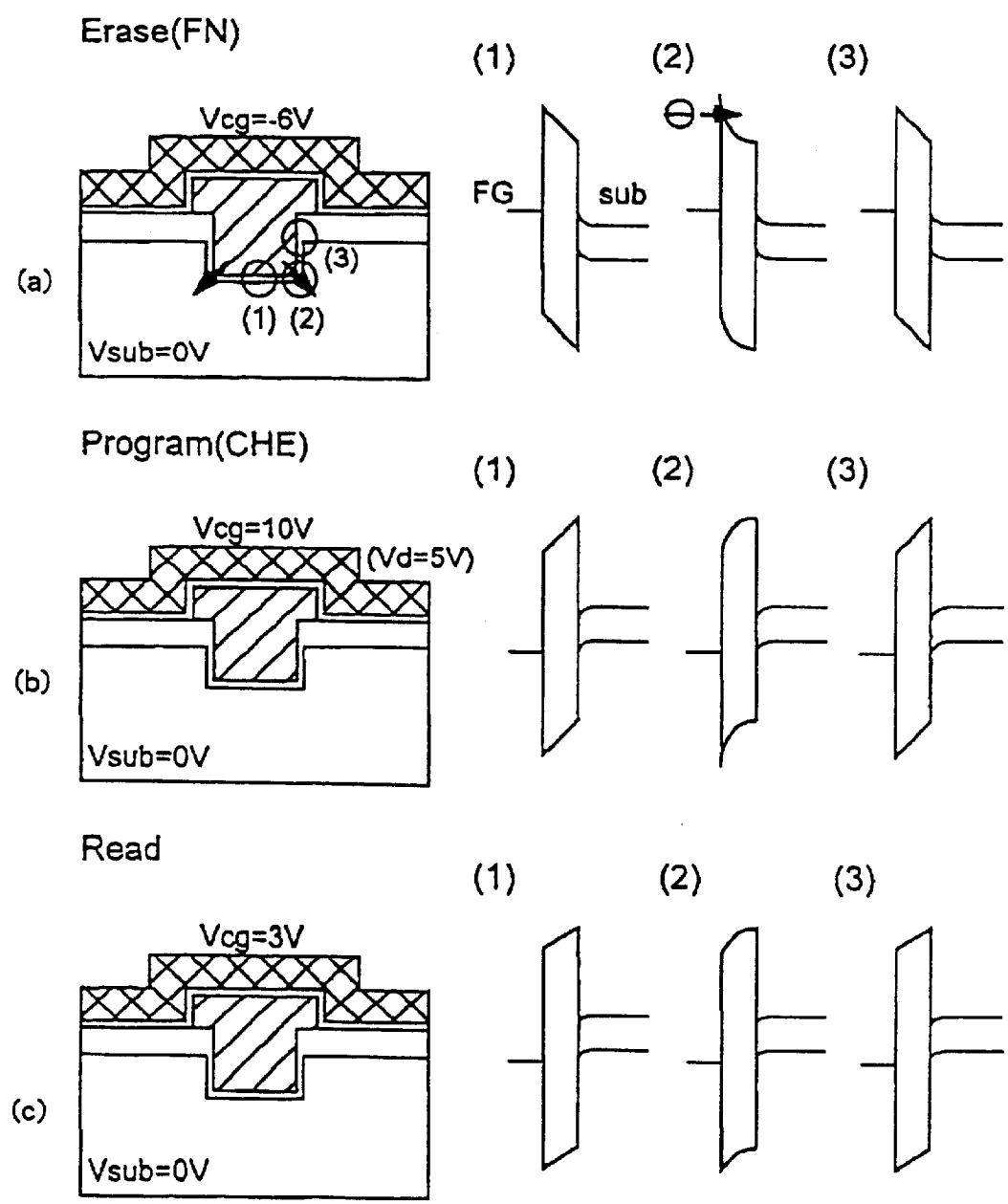
FIG. 10 is a view illustrative of (a) erasing operation, (b) writing operation and (c) reading operation in one mode of a flash memory.

Erasing, writing and reading operations of the flash memory are the same as in the practicable mode 1. Energy levels at positions of (1)–(3) of FIG. 9 are shown in FIG. 10. Namely, in the erasing operation, as shown in FIG. 10(a), the control gate is applied with −6V, whilst the semiconductor substrate is grounded, so that electrons are extracted from the corner of the floating gate. In the write operation shown in FIG. 10(b), the same voltages are applied to inject hot electrons in to the floating gate through the gate insulation film from the channel region between the source and drain regions. Voltages to be applied in the reading operation shown in FIG. 10(c) are set similarly to the practicable mode 1 to read out data.

Practicable Mode 2

In accordance with the flash memory of this mode, the floating gate is T-shaped to allow electrons to be extracted at the corner (concave corner) of the trench from the floating gate and also electrons tone injected at the top corner (convex corner) of the trench to the floating gate.

Figure 11:
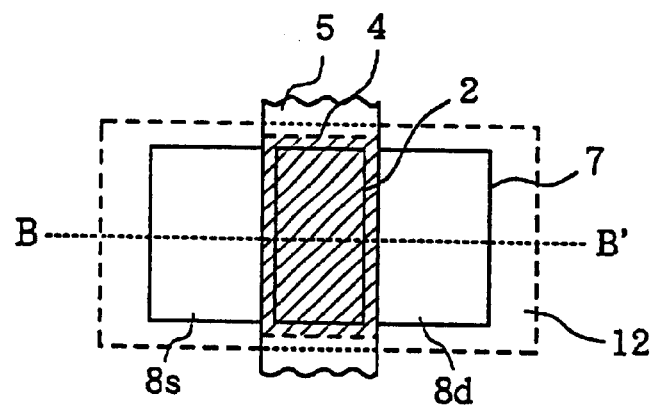
FIG. 11 is a view illustrative of one mode of a flash memory.
Figure 11:
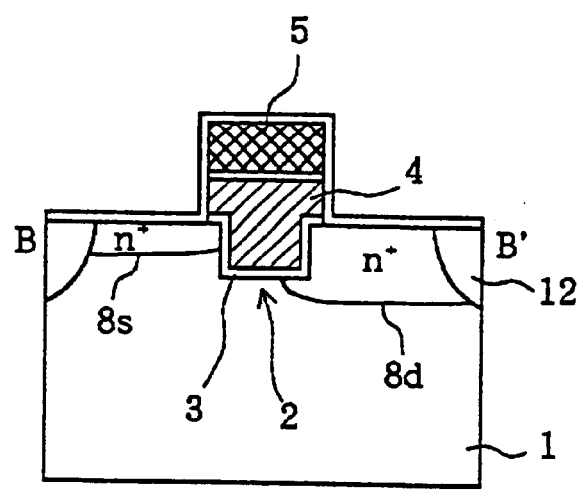

An example thereof is shown in FIG. 11 ((a) plan view, (b) B–B' cross sectional view). In this example, a surface of the semiconductor substrate 1 is divided by the device isolation film 12 into device formation regions 7 with a rectangle shape in plan to form individual memory cells.

As shown in FIGS. 11(a) and (b), the trench with the rectangle-shape in cross section is formed to divide the device formation region and extends in the vicinity of the center of the device formation region 7. In this example, the trench is independent from the other memory cell. The gate insulation film 3 is formed on the surface free from the trench and the floating gate 4 is formed. The control gate 5 as the word line is provided on the insulation film thereof in a longitudinal direction in FIG. 11(a).

The drain 8d and the source 8s are formed at opposite sides of the trench on the device region surface isolated, and are connected to a bit line and a source line through selecting MOSFETs provided separately from the memory cells via contacts to form an AND-type flash memory.

FIG. 12 is an enlarged view illustrative of the floating gate in section in correspondence with FIG. 11(b).

In this mode, similarly to the practicable mode 1, at (2), the trench corner (concave corner) faces to the corner of the floating gate via the uniform-thickness gate insulation film, and additionally at (3), the corner (concave corner) of the floating gate 4 is provided which faces to the trench top corner (convex corner) via the uniform-thickness gate insulation film.

Figure 13:
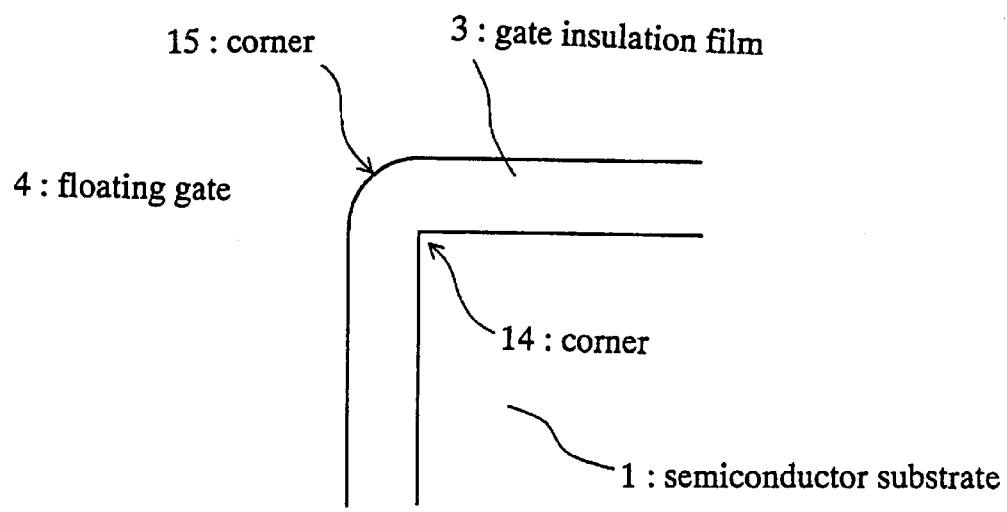
FIG. 13 is an enlarged view illustrative of a top edge of the trench in one mode of a flash memory.

FIG. 13 is an enlarged view of (3). The shapes and thicknesses of the corner 14 of the semiconductor substrate 1, the corner 15 of the floating gate 4 and the gate insulation film between them are quite identical with the shapes and thicknesses of the corner of the floating gate, the corner of the semiconductor substrate and the gate insulation film between them described in the practicable mode 1.

In this example, the diffusion layer of the drain region 8d is formed to be deep to allow electrons to be extracted into the drain region side, and injections of electrons into the floating gate are made from the source region 8s and the drain region 8d.

The erasing and writing operations of the flash memory will be described with reference to FIG. 14. In the flash memory, the extraction of electrons from the floating gate correspond to the write operation. As shown in FIG. 14(a), for example, the control gate is applied with −3V, and the drain region is applied with 3V and the source region is grounded or floated, so that at the corner of the trench at a position (2), electrons are moved from the floating gate to the drain region by the F-N current. As shown in the energy level diagram, the effective thickness of the insulation film is made thin at the position (2).

Figure 14:
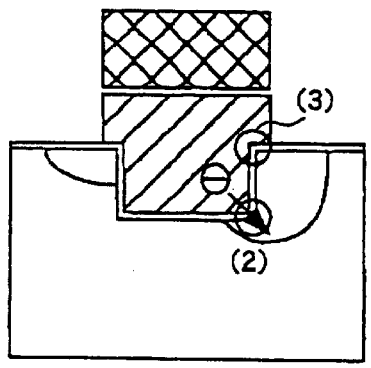
FIG. 14 is a view illustrative of (a) erasing operation and (b) writing operation in one mode of a flash memory.
Figure 14:
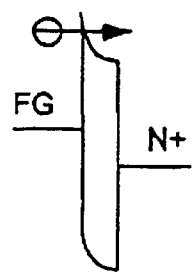
Figure 14:
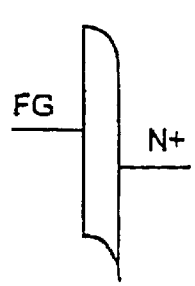
Figure 14:
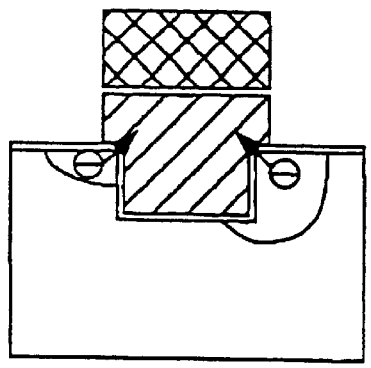
Figure 14:
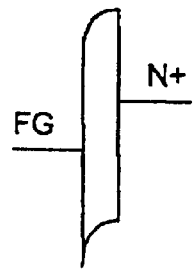
Figure 14:
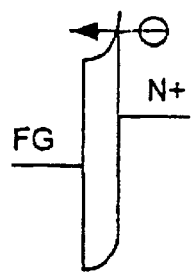

In the erasure operation, as shown in FIG. 14 (b), the source and drain regions are grounded and the control gate is applied with 6V, so that at a position (3) or the top corner of the trench, the F-N tunneling current is caused whereby electrons are injected into the floating gate from the source and drain regions.

The reading operation is judged depending upon whether or not a predetermined current flows through the source and drain regions.

In this mode, both the write and erasing operations utilize the F-N tunneling current to reduce the consumed current and reduce the voltage without loosing the reliability. It is also advantageous that the stack structure over the semiconductor substrate is not made thick.

In the fabrication method of this mode, the gate insulation film at the top of the trench is formed at the same time when the gate insulation film is formed in the trench, so that the uniformly thick film as the gate insulation film in the trench can be obtained. After the gate insulation film on the top of the trench and he gate insulation film in the trench are formed, then the floating gate material is deposited to be patterned to remain at the trench edges to obtain a T-shaped floating gate.

Practicable Mode 3

Figure 15:
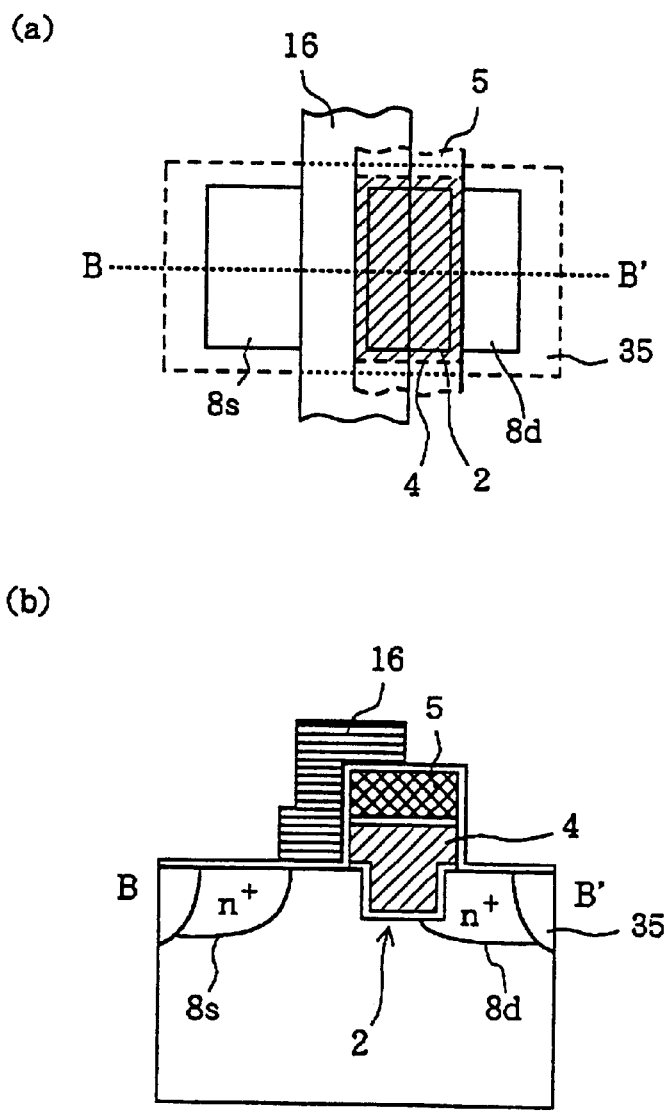
FIG. 15 is a view illustrative of one mode of a flash memory.

In this mode, as shown in FIG. 15 ((a) plan view, (b) B–B' cross section) and FIG. 16 (enlarged view of FIG. 15(b)), the source region 8s is provided to be distanced from the floating gate. Further, the select gate 16 is provided on the semiconductor substrate surface between the source region 8s and he floating gate 4. Namely, the select gate 16 controls carriers in the channel region between the source region under the gate and the floating gate.

The erasing and writing operations will be described by using FIG. 17.

Figure 17:
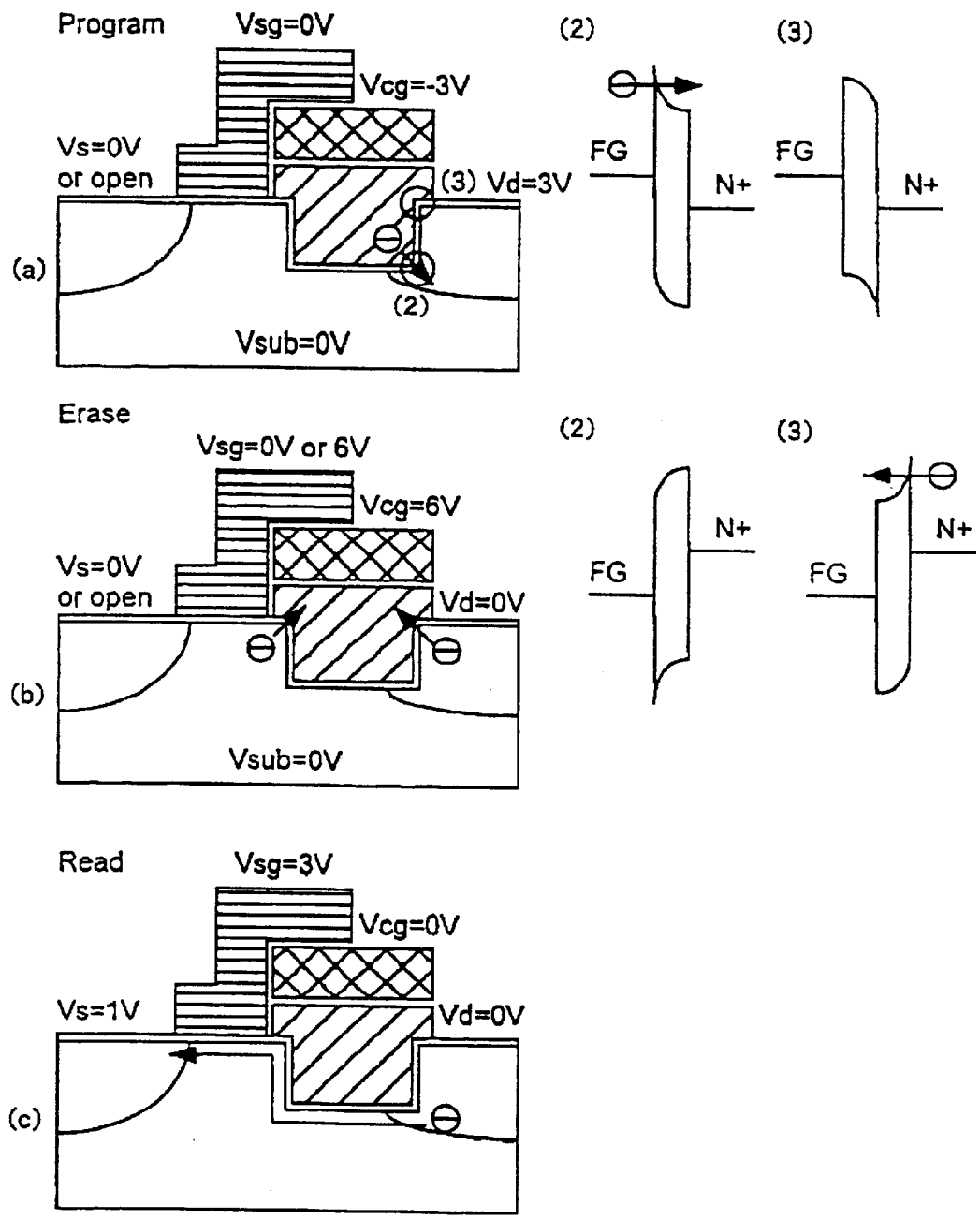
FIG. 17 is a view illustrative of (a) erasing operation, (b) writing operation and (c) reading operation in one mode of a flash memory.

As shown in FIG. 17, in the write operation, as in the practicable mode 2, at the trench corner marked with (2), electrons are extracted from the floating gate to the drain region 8d via the F-N tunneling, wherein the select gate voltage is set at the ground voltage.

In the erasure operation, at the position (3) or the top corner of the trench, electrons are injected from the drain region into the floating gate by the F-N tunneling, wherein the source voltage may be either the ground state or he floating state. The select gate is applied with, for example, 0V or 6V.

In the reading operation, the control gate and the drain voltage are made into the ground state and the source voltage is set at 1V. The select gate is applied with 3V to form a channel under the select gate. In this state, the write state or erasing state is judged depending upon whether or not the predetermined current flows through the source and drain regions.

In this mode, in the reading operation, the select gate is applied with a positive voltage to make the control gate 0V. The field to be applied to the gate insulation film is only a self-field, whereby it is possible to surely prevent miss-erasing (electron injection) in the reading operation and also the reliability can be improved.

First Embodiment

Figure 18:
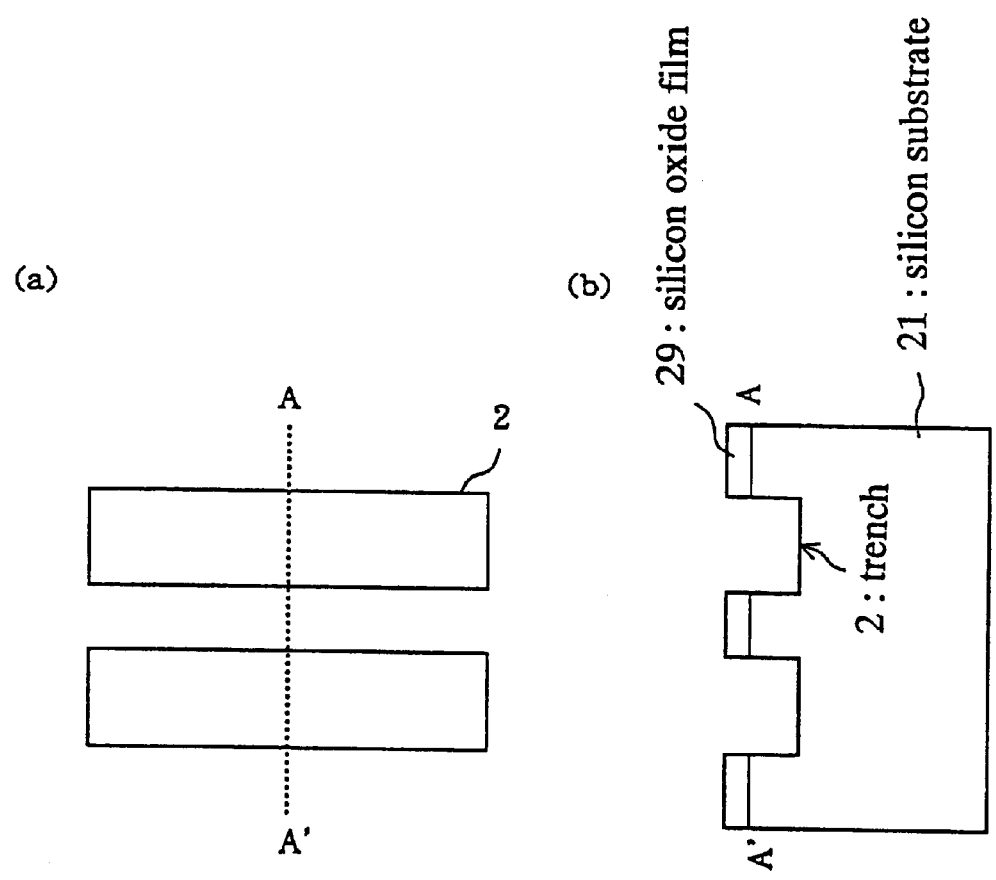
FIG. 18 is a view illustrative of a fabrication method in a first embodiment, (a) plan view, (b) A–A' sectioned view.

The fabrication method for the flash memory in the practicable mode 1-1 will be described in detail. On a surface of a p-type silicon substrate 21, a silicon oxide film 29 with a thickness of, for example, 500–2000 angstroms is formed by a CVD method before a predetermined part thereof is subjected to a dry etching to form a trench 2 with a sectional shape of rectangle and with a depth of 0.05–0.2 micrometers from the silicon substrate surface (FIG. 18(a) plan view and (b) cross sectional view).

Figure 19:
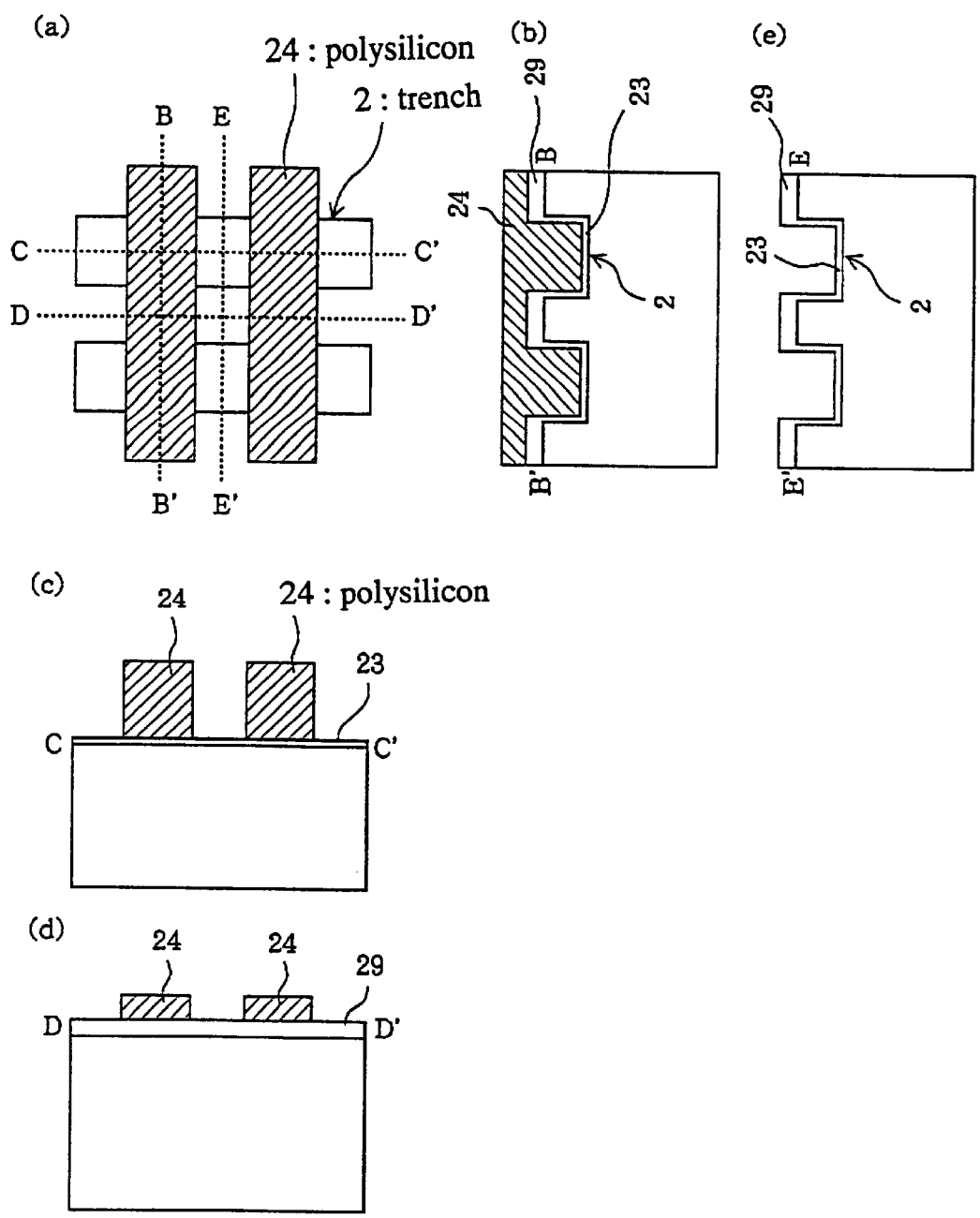
FIG. 19 is a view illustrative of a fabrication method in a first embodiment, (a) plan view, (b) B–B' sectioned view, (c) C–C' sectioned view, (d) D–D' sectioned view, and (e) E–E' sectioned view.

Subsequently, on the silicon substrate surfaces exposed to the bottom and walls of the trench, a gate oxide film 23 of 100 angstroms in thickness is formed by a thermal oxidation. A polysilicon 24 with a thickness of 1000–2500 angstroms is deposited entirely by the CVD method before as shown in plan view of FIG. 19(a), the patterning is made into a stripe-shape in a direction (longitudinal direction in the drawing) perpendicular to the trench 2. In the plan view of FIG. 19(a), an A–A' section, a B–B' section, a C–C' section, a D—D section and an E–E' section are shown in (b) to (e) respectively. (the same as below drawings).

Figure 20:
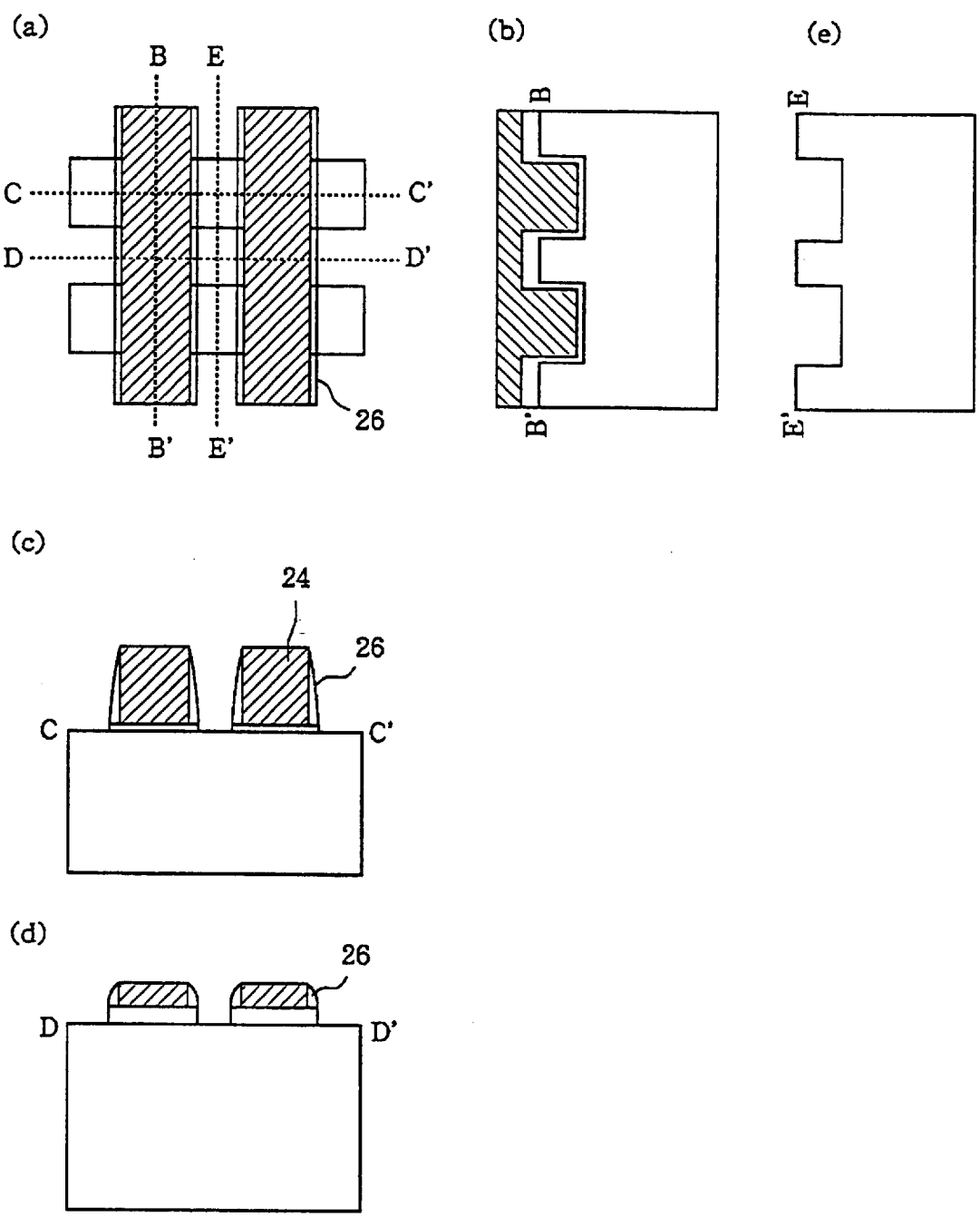
FIG. 20 is a view illustrative of a fabrication method in a first embodiment, (a) plan view, (b) B–B' sectioned view, (c) C–C' sectioned view, (d) D–D' sectioned view, and (e) E–E' sectioned view.

After the silicon oxide film is deposited by the CVD method, the etch back is made to form side wall oxide films 26 as shown in FIG. 20.

Figure 21:
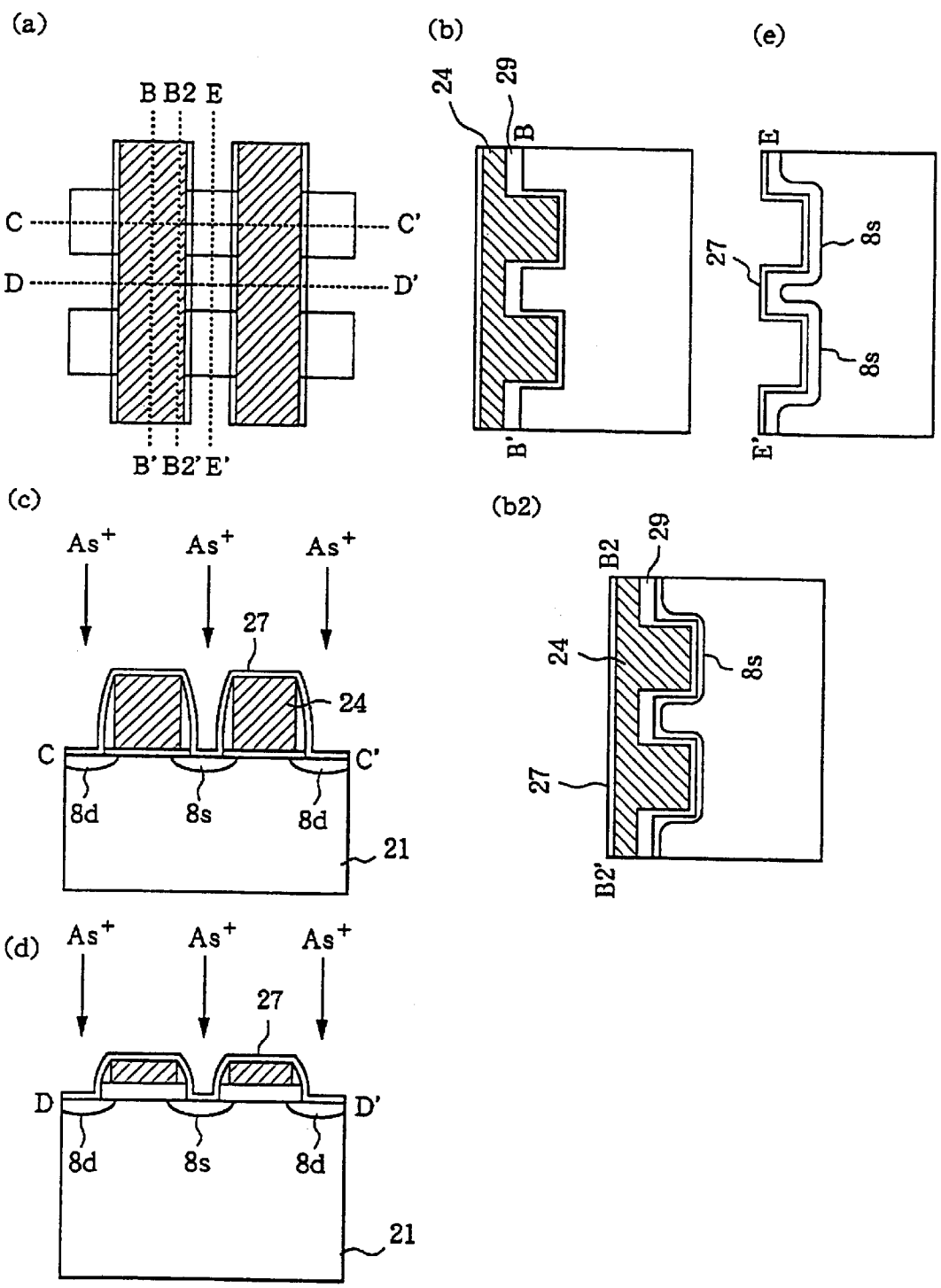
FIG. 21 is a view illustrative of a fabrication method in a first embodiment, (a) plan view, (b) B–B' sectioned view, (b2) B2–B2' sectioned view, (c) C–C' sectioned view, (d) D–D' sectioned view, and (e) E–E' sectioned view.
Figure 22:
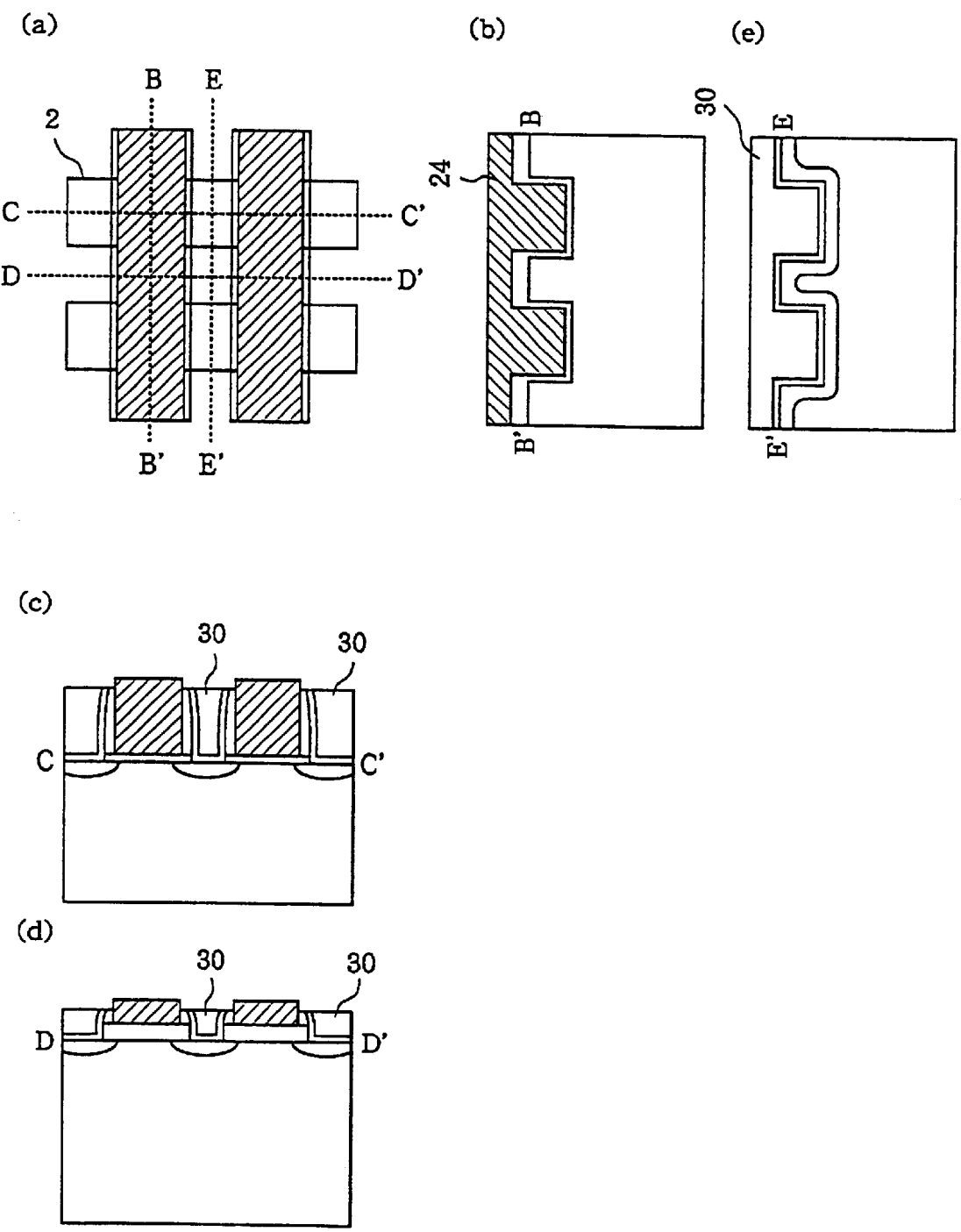
FIG. 22 is a view illustrative of a fabrication method in a first embodiment, (a) plan view, (b) B–B' sectioned view, (c) C–C' sectioned view, (d) D–D' sectioned view, and (e) E–E' sectioned view.

Thereafter, as shown in FIG. 21, the surface is covered with a dummy oxide film 27 before arsenic is ion-implanted into the silicon substrate to form the source region 8s and the drain region 8d.

The silicon oxide film is deposited by the CVD method for subsequent etch-back to bury a silicon oxide film 30 within a gap between the stripes of the polysilicon 24 to relax the step between the stripes.

Figure 23:
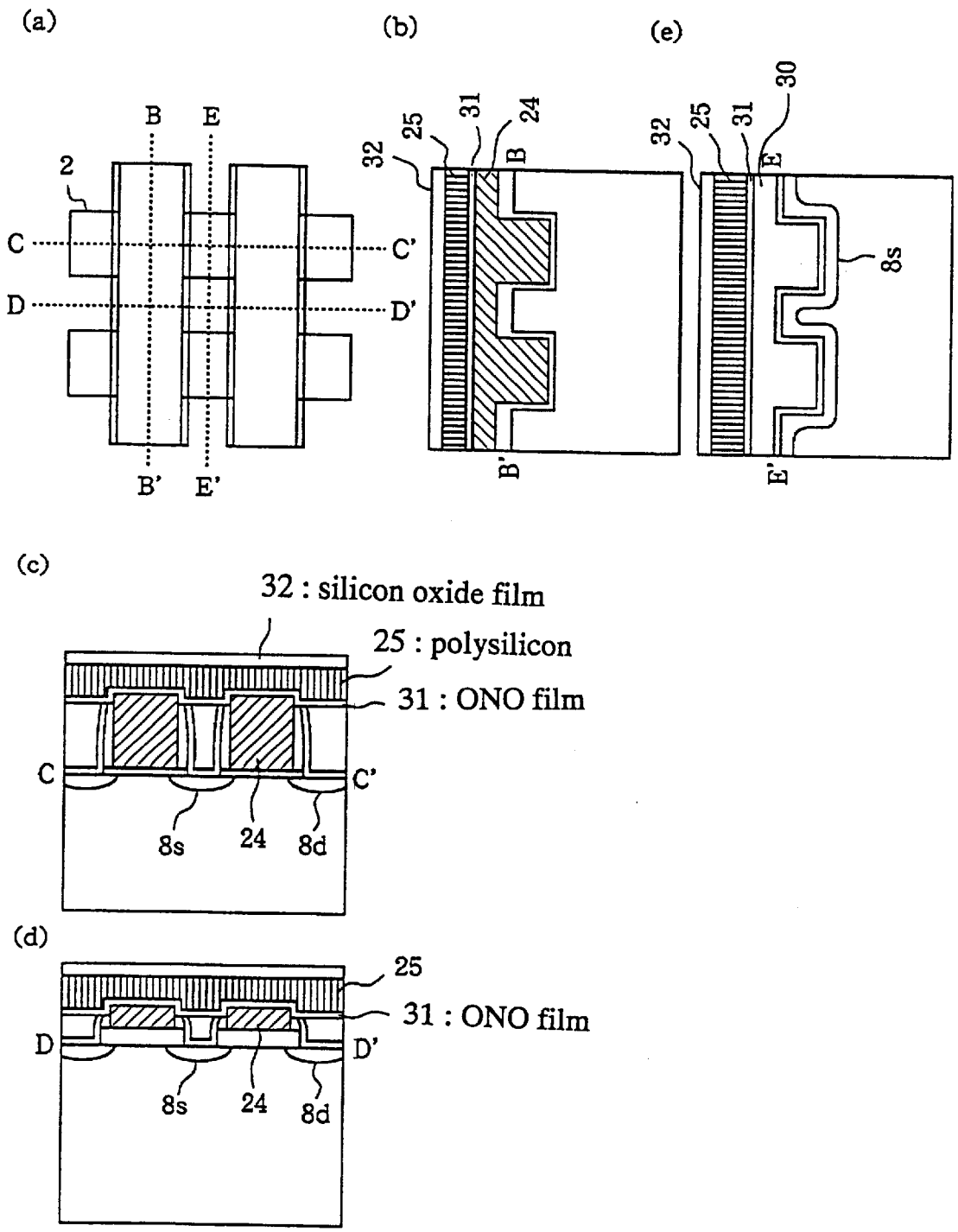
FIG. 23 is a view illustrative of a fabrication method in a first embodiment, (a) plan view, (b) B–B' sectioned view, (c) C–C' sectioned view, (d) D–D' sectioned view, and (e) E–E' sectioned view.

As shown in FIG. 23, a silicon oxide film (30–60 angstroms in thickness), a silicon nitride film (80–100 angstroms in thickness), and a silicon oxide film (30–60 angstroms in thickness) are entirely deposited by the CVD method sequentially, thereby forming an ONO film 31 as a floating gate-control gate inter-insulator of 140–220 angstroms in thickness. Further, a silicon oxide film 32 with 500–2000 angstroms in thickness is deposited.

Figure 24:
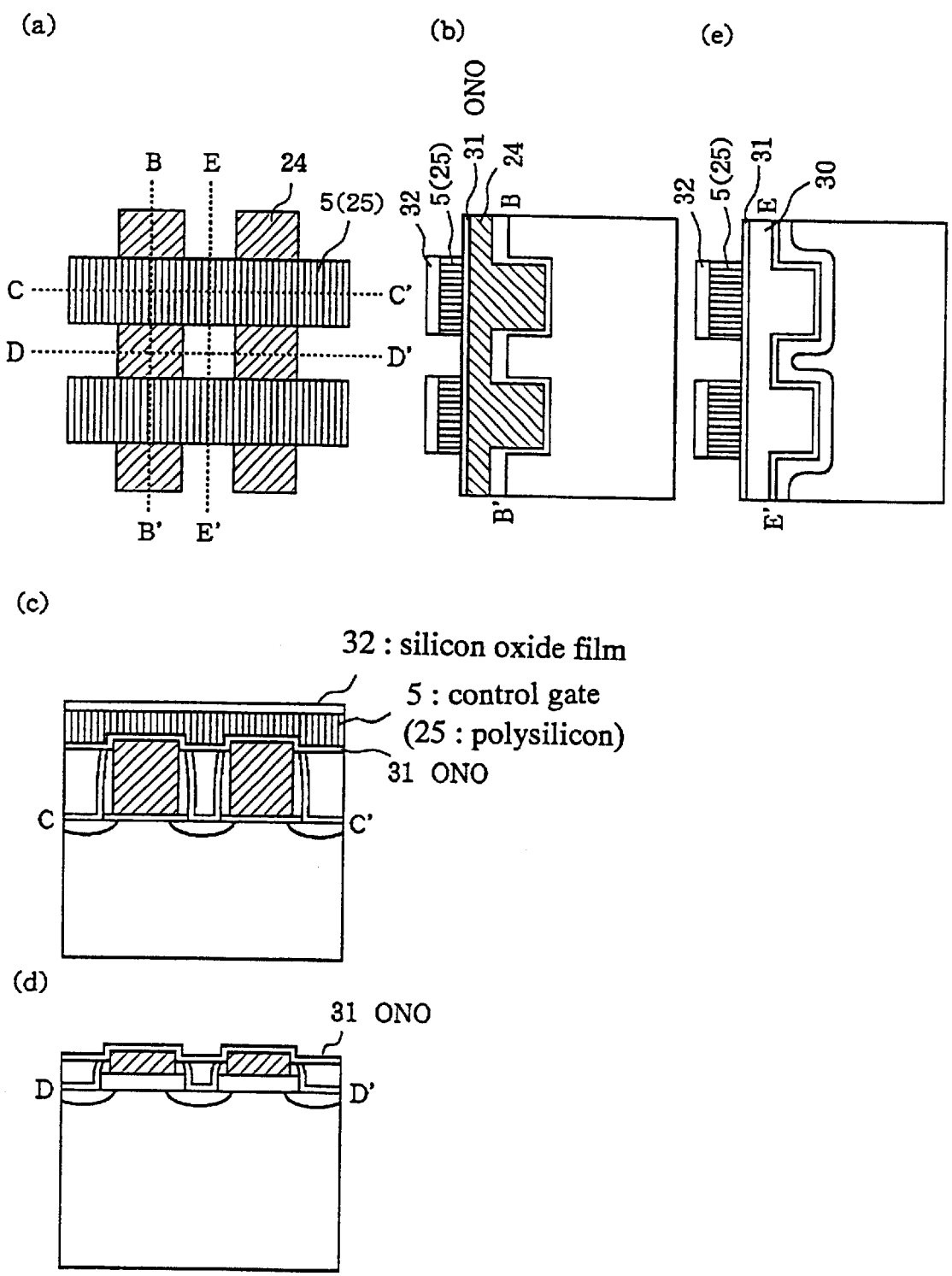
FIG. 24 is a view illustrative of a fabrication method in a first embodiment, (a) plan view, (b) B–B' sectioned view, (c) C–C' sectioned view, (d) D–D' sectioned view, and (e) E–E' sectioned view.

The silicon oxide film 32 is etched for subsequent etching to the polysilicon to be patterned into a stripe-shape along the top of the trench 2 as shown in FIG. 24 (in a lateral direction in the drawing) thereby to form a control gate 5. In this stage, as shown in FIG. 24(a), the polysilicon 24 and the control gate 5 (polysilicon 25) extend across at the right angle.

Figure 25:
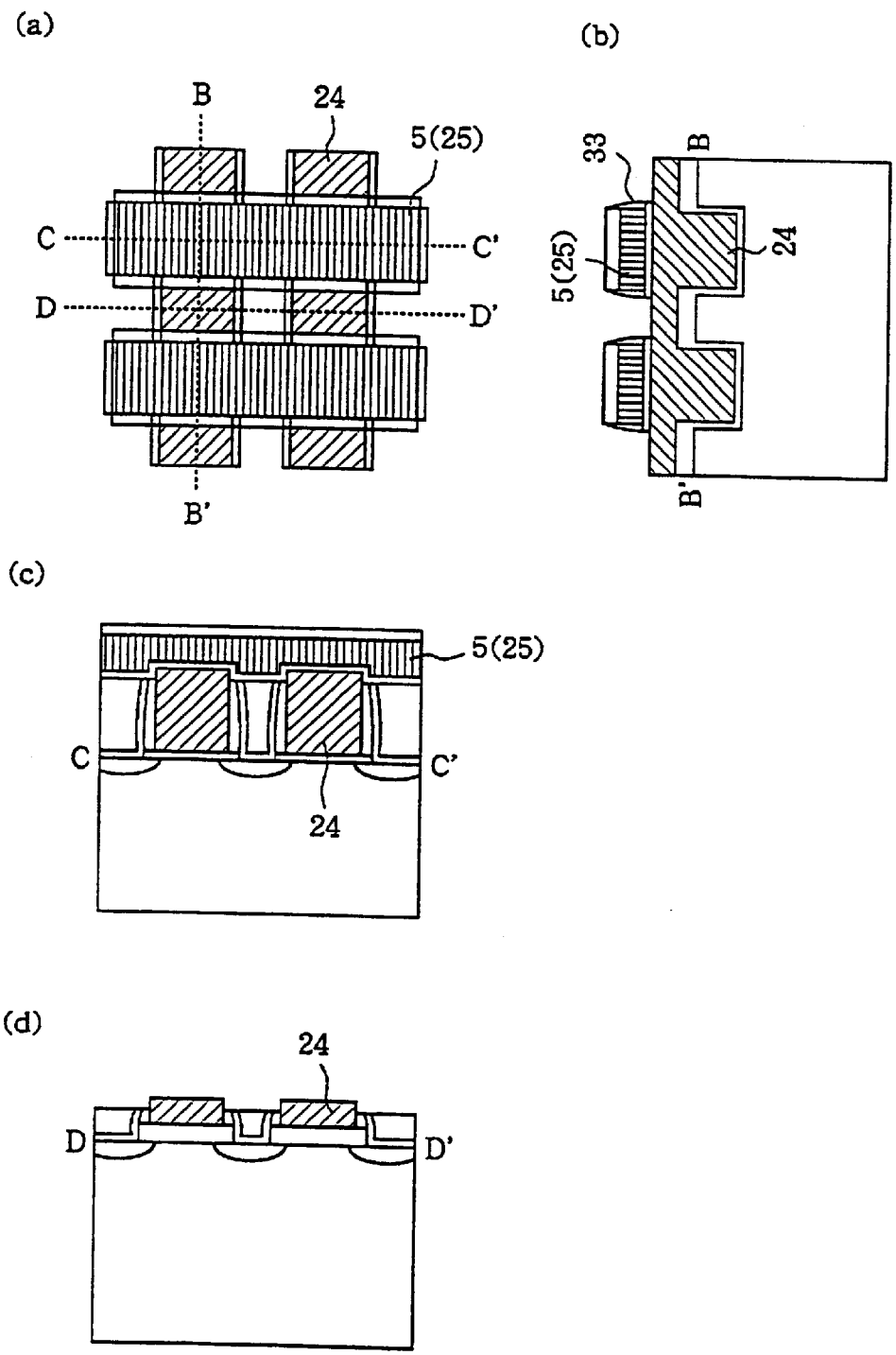
FIG. 25 is a view illustrative of a fabrication method in a first embodiment, (a) plan view, (b) B–B' sectioned view, (c) C–C' sectioned view, and (d) D–D' sectioned view.

As shown in FIG. 25, a silicon oxide film is deposited y the CVD method prior to etch-back to form side wall oxide films 33 on side walls of the control gate 5. At this time, the ONO film 31 uncovered with the control gate 5 and the side wall oxide films 33 are removed.

Figure 26:
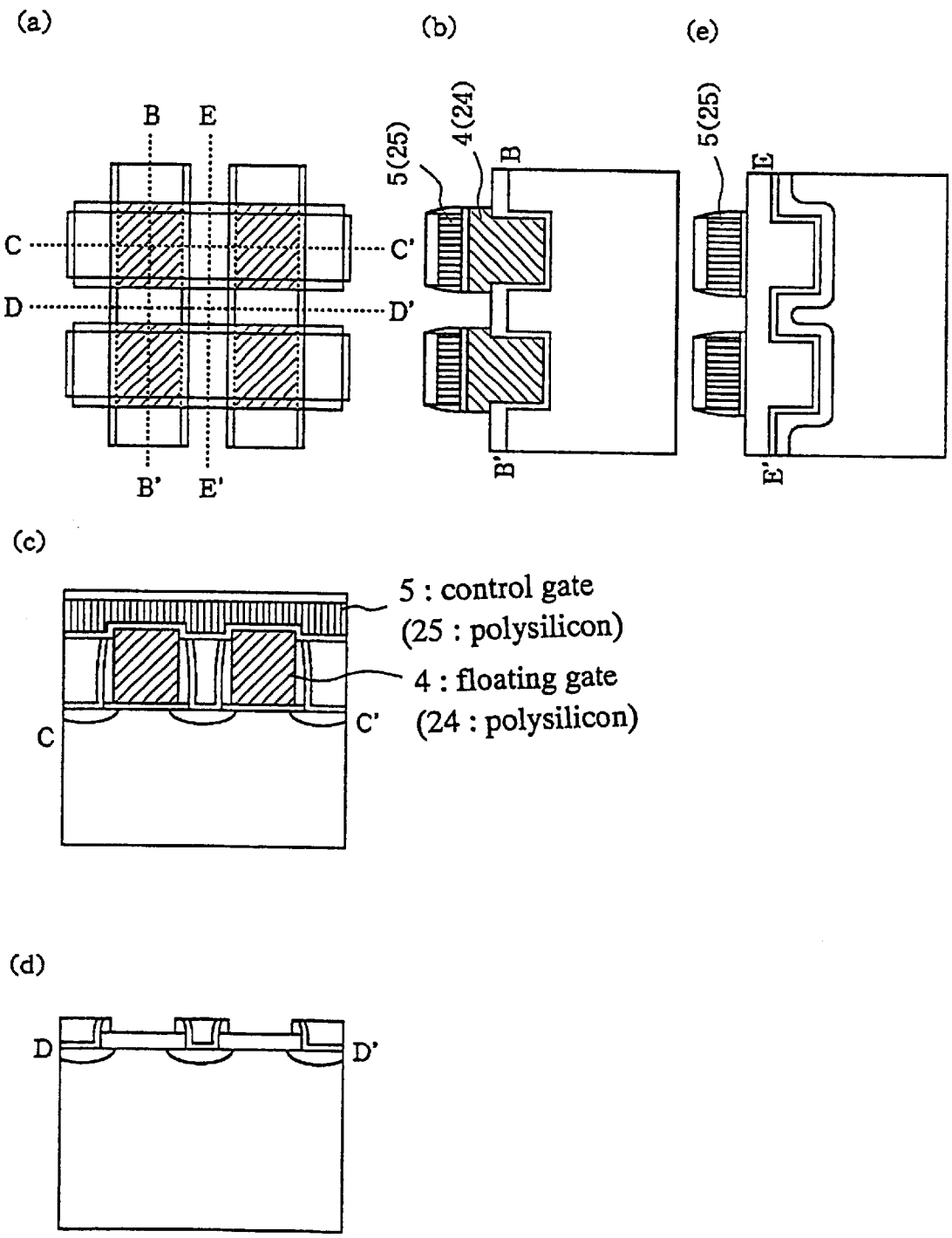
FIG. 26 is a view illustrative of a fabrication method in a first embodiment, (a) plan view, (b) B–B' sectioned view, (c) C–C' sectioned view, (d) D–D' sectioned view, and (e) E–E' sectioned view.

The polysilicon is etched by use of the control gate 5 and the side wall oxide films 33 as masks to form floating gates separated from each other as shown in FIG. 26 to complete the memory cell structure of the flash memory.

Second Embodiment

The flash memory of the structure as shown in the above practicable mode 1-2 will be described.

Figure 27:
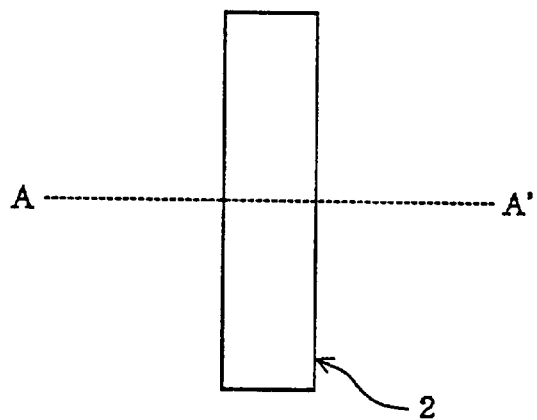
FIG. 27 is a view illustrative of a fabrication method in a second embodiment, (a) plan view, and (a') A–A' sectioned view.
Figure 27:
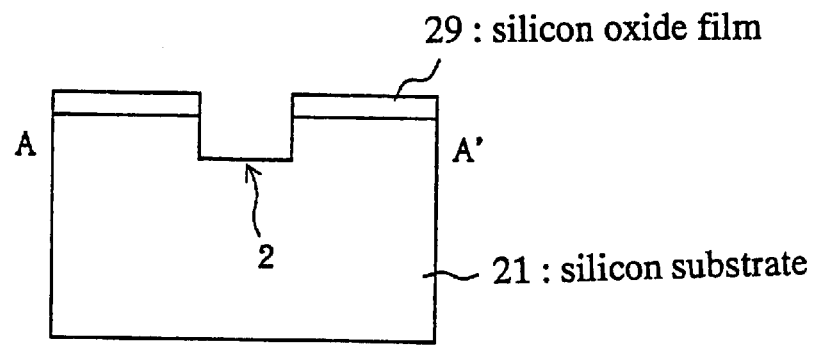

As shown in FIG. 27, similarly to the first embodiment, the silicon oxide film 29 is formed and then subjected to a dry etching to form a trench 2 with a sectional shape in rectangle (FIG. 27(a) plan view and (a') sectional view).

Figure 28:
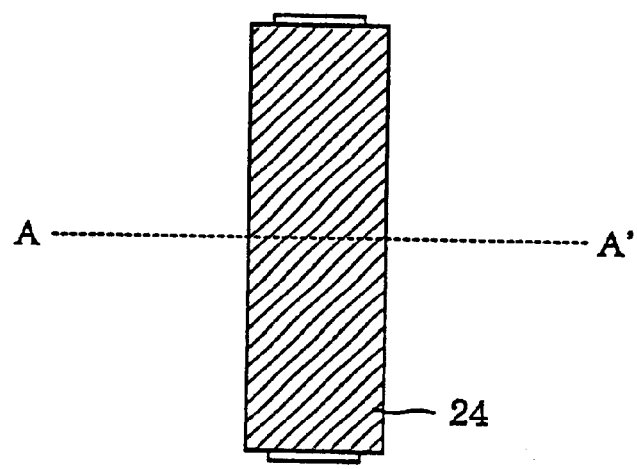
FIG. 28 is a view illustrative of a fabrication method in a second embodiment, (a) plan view, and (a') A–A' sectioned view.
Figure 28:
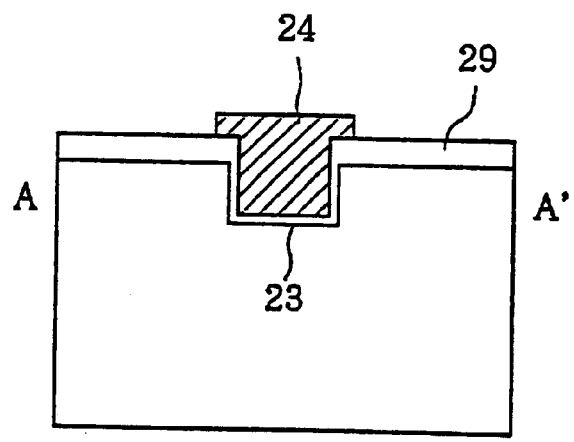

On the silicon substrate surface exposed in the same manner as in the first embodiment, a gate oxide film 23 is formed and a polysilicon 24 is entirely deposited before differently from the first embodiment as shown in plan view of FIG. 28 (a), with keeping the trench 2 to be filled with the polysilicon, patterning is made into a stripe-shape in the same direction (longitudinal direction) as the trench.

Figure 29:
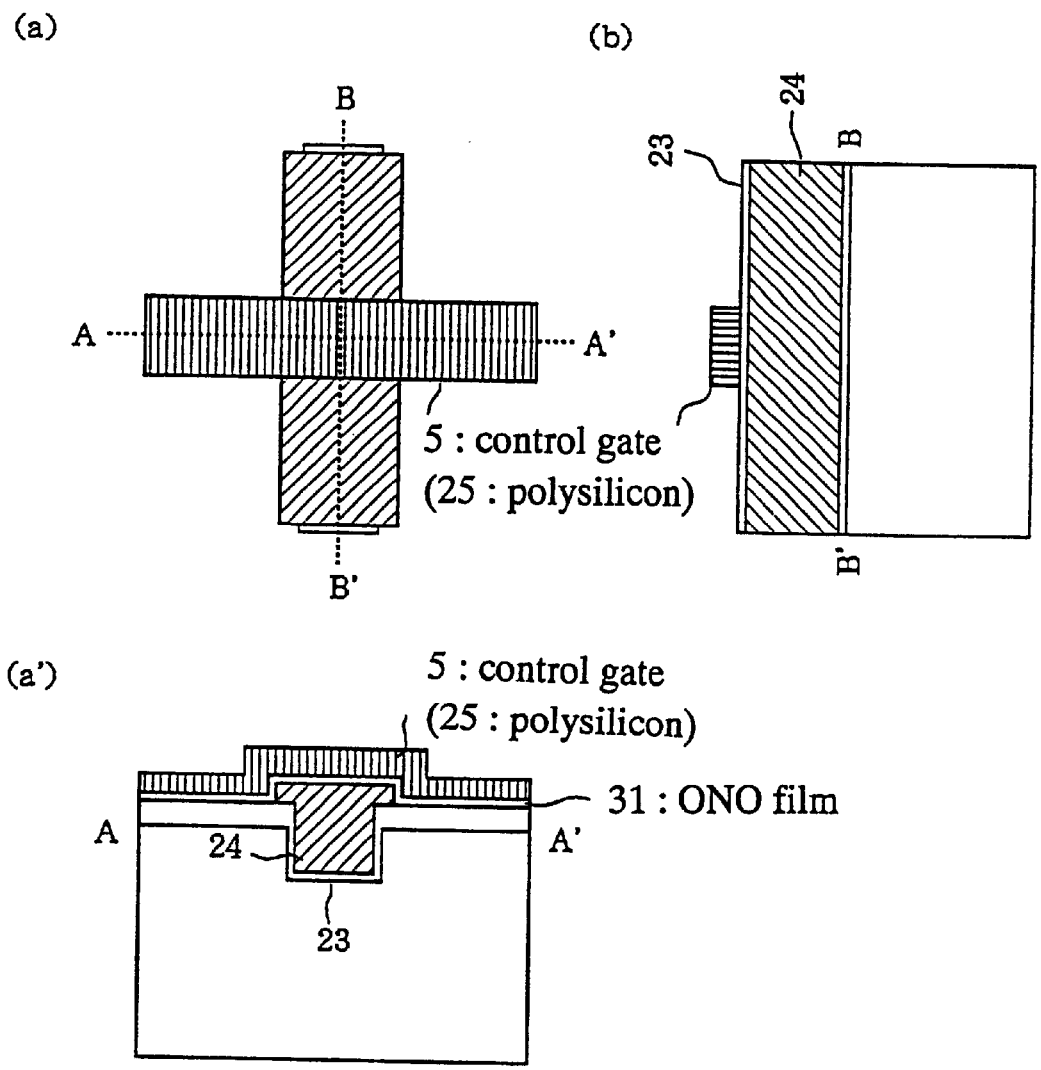
FIG. 29 is a view illustrative of a fabrication method in a second embodiment, (a) plan view, (a') A–A' sectioned view, and (b) B–B' sectioned view.

As shown in FIG. 29, the ONO film 31 is formed with the same material as in the first embodiment (floating gate-control gate inter-insulator), before a polysilicon 25 is further deposited so that a patterning is made into a stripe-shape across at the right angle to the trench thereby forming the control gate 5.

Figure 30:
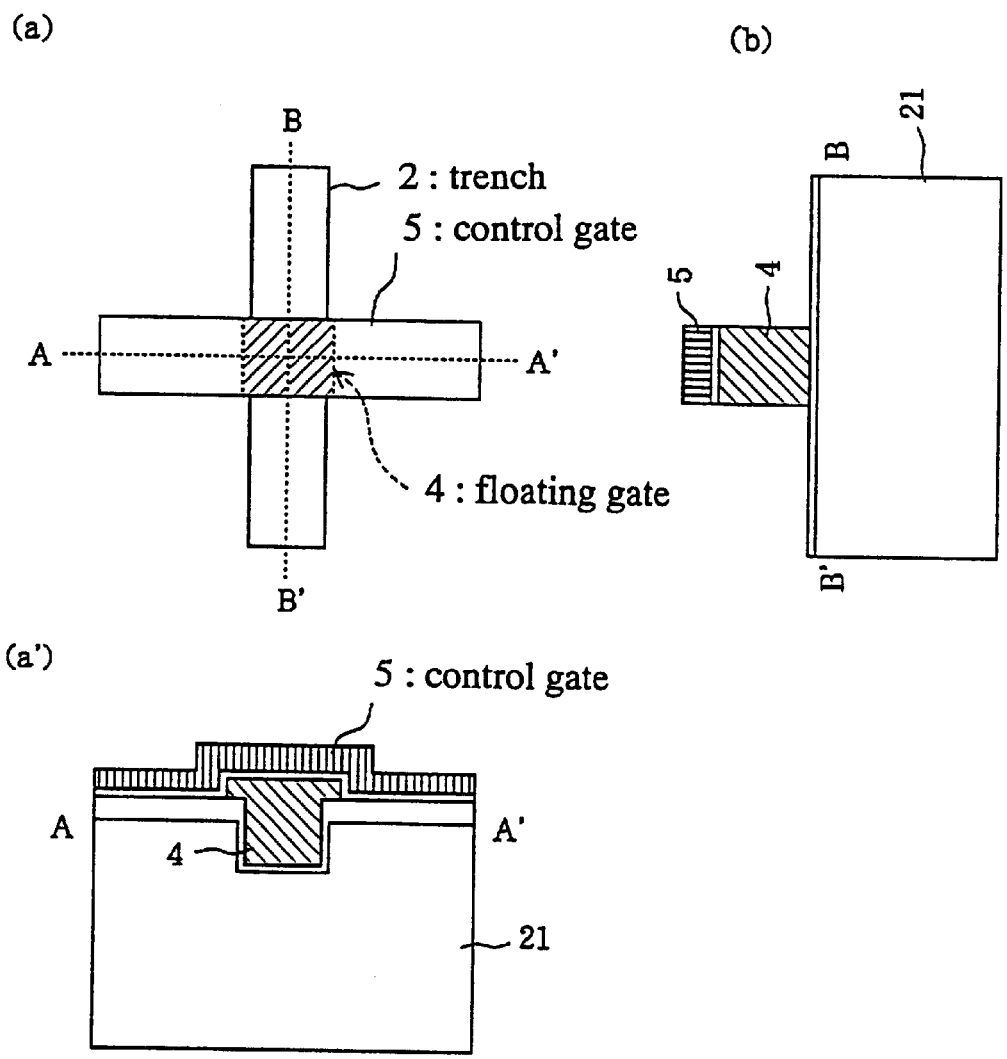
FIG. 30 is a view illustrative of a fabrication method in a second embodiment, (a) plan view, (a') A–A' sectioned view, and (b) B–B' sectioned view.

As shown in FIG.30, the ONO film 31 is etched for subsequent etching the polysilicon 24 to form floating gates 4 separated from each other. In FIG. 30(a), hatching to the control gate 5 is omitted but the floating gate 4 thereunder is cross-hatched.

Figure 31:
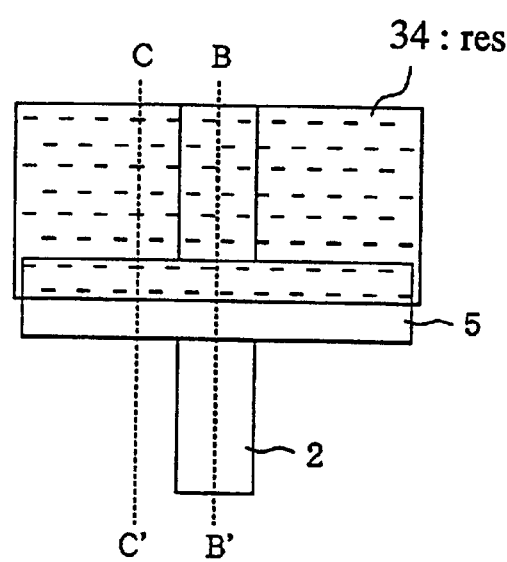
FIG. 31 is a view illustrative of a fabrication method in a second embodiment, (a) plan view, (b) B–B' sectioned view, and (c) C–C' sectioned view.
Figure 31:
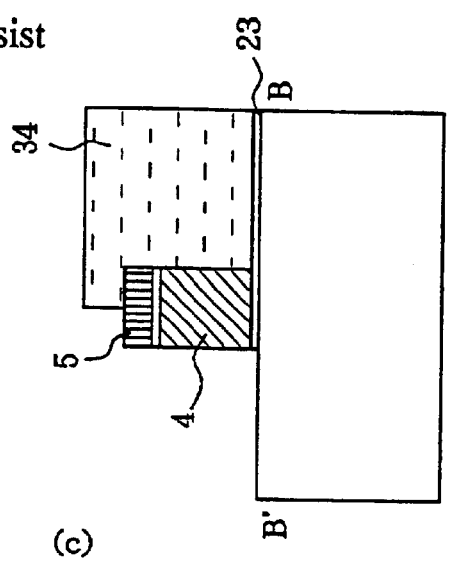
Figure 31:
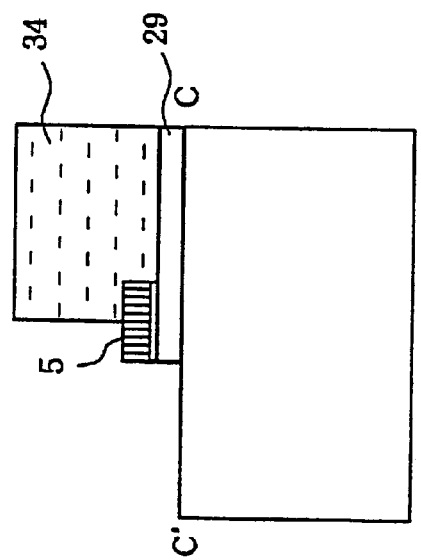

As shown in FIG. 31, a half is covered along the control gate 5 with a resist 34 so that the silicon oxide film 29 and the gate oxide film 23 on the substrate surface uncovered by the resist are removed to expose the substrate surface.

Figure 32:
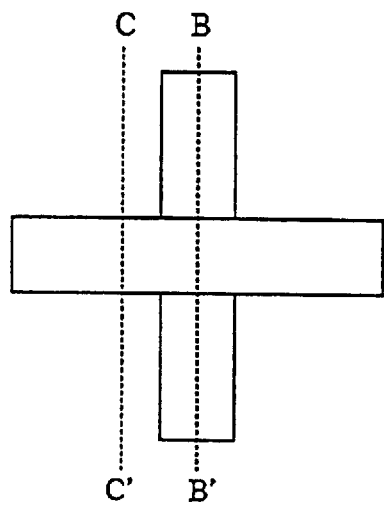
FIG. 32 is a view illustrative of a fabrication method in a second embodiment, (a) plan view, (b) B–B' sectioned view, and (c) C–C' sectioned view.
Figure 32:
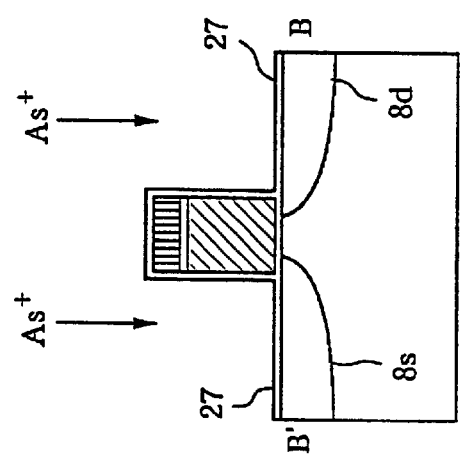
Figure 32:
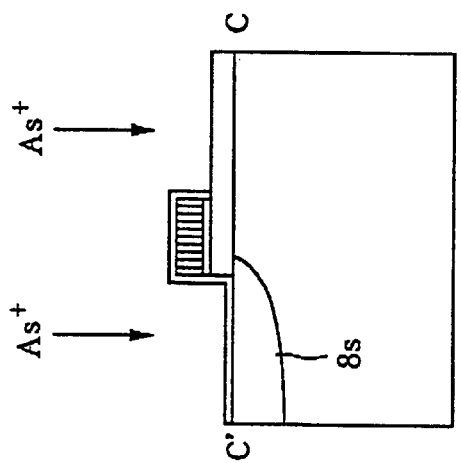

After the resist 34 is removed, then the dummy oxide film 27 is formed on the surface as shown in FIG. 32 before arsenic is ion-implanted into the silicon substrate by use of the control gate as a mask to form the source region 8s and the drain region 8d, thereby completing the memory cell structure. In this example, in the lateral direction of FIG. 32(a), the source region is common to the plural memory cells and may be used as a buried line. The drain region is independent but is connected via the contact to the bit line.

Third Embodiment

Figure 33:
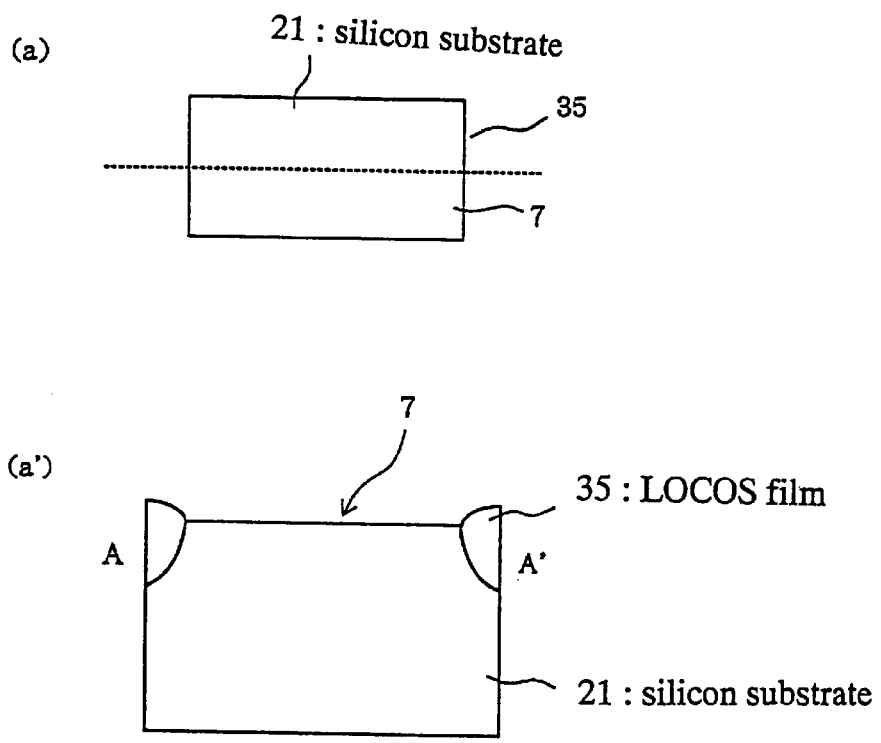
FIG. 33 is a view illustrative of a fabrication method in a third embodiment, (a) plan view, and (a') A–A' sectioned view.

In this example, the flash memory with the structure of the above practicable mode 2 will be described. As shown in FIG. 33, LOCOS films 35 are formed as device isolation films on predetermined areas of an n-type silicon substrate 21 to isolate a device formation region 7 for forming a memory cell.

Figure 34:
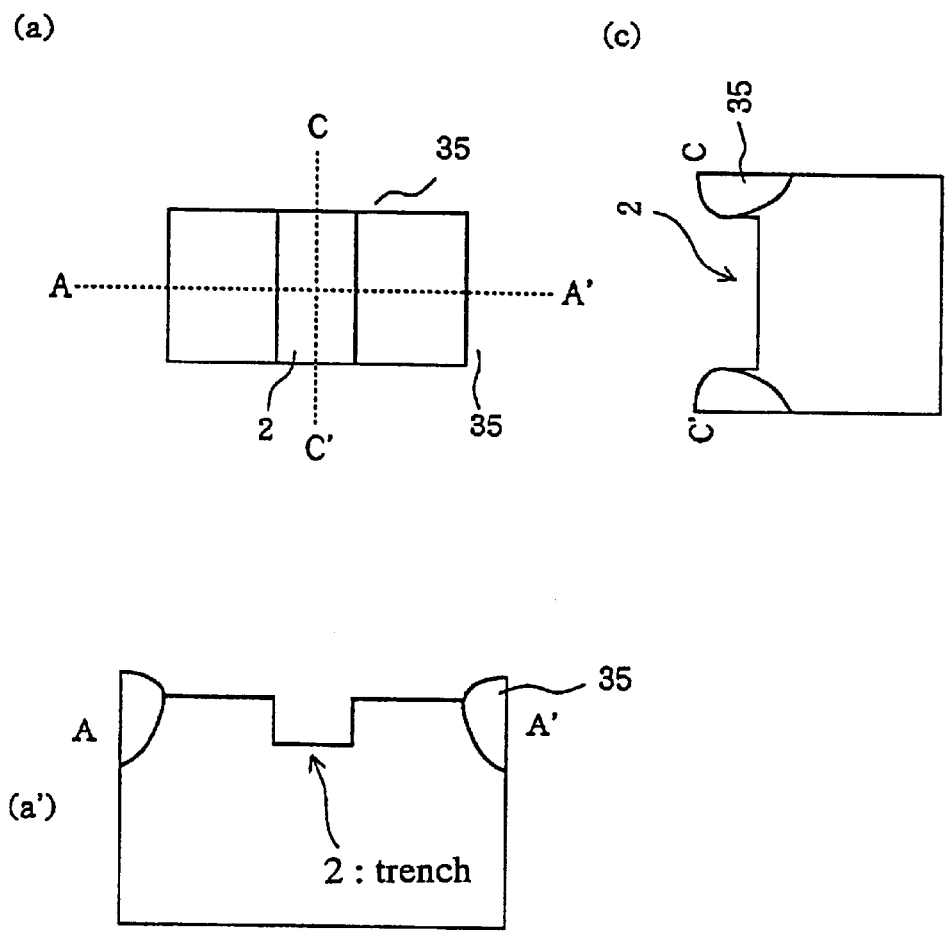
FIG. 34 is a view illustrative of a fabrication method in a third embodiment, (a) plan view, (a') A–A' sectioned view, and (c) C–C' sectioned view.

As shown in FIG. 34, a trench 2 with a cross-sectional shape of rectangle is formed by a dry etching on the device formation region. A depth of the trench is set 0.3–0.6 micrometers in consideration of the depth of the source region and the drain region.

Figure 35:
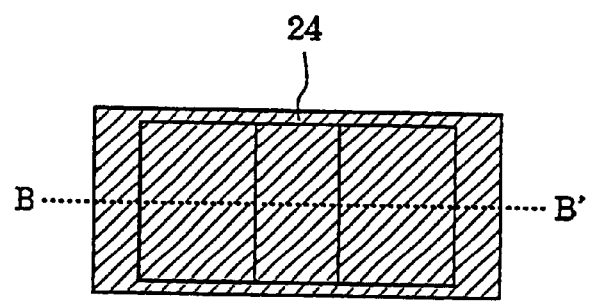
FIG. 35 is a view illustrative of a fabrication method in a third embodiment, (a) plan view, and (b) B–B' sectioned view.
Figure 35:
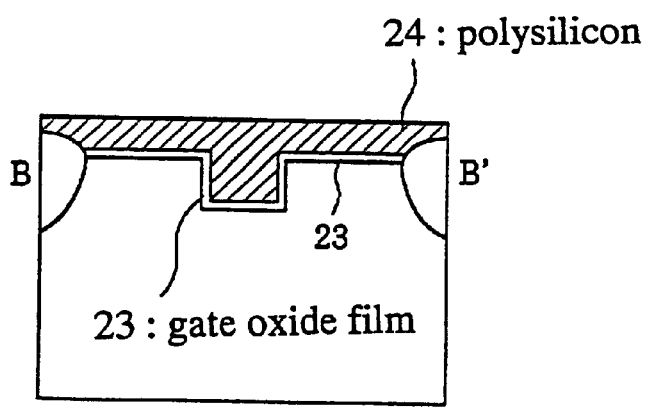

A surface of the silicon substrate 21 is subjected to a thermal oxidation to form a gate insulation film 23 entirely. A polysilicon 24 is entirely deposited by the CVD method before as shown in plan view of FIG. 35(a), patterning is made to a stripe-shape in a lateral direction with a slightly wider than a length in longitudinal direction of the trench, whereby a length in longitudinal direction of the floating gate is decided.

Figure 36:
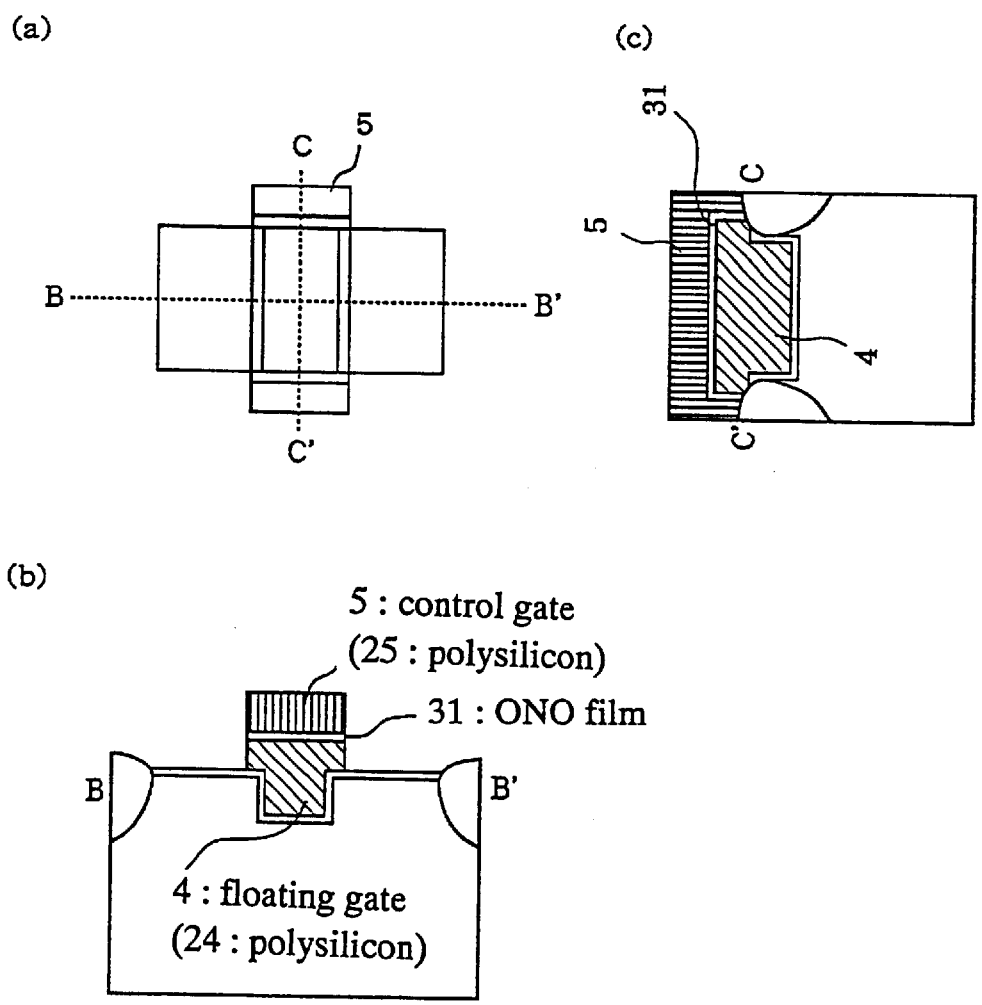
FIG. 36 is a view illustrative of a fabrication method in a third embodiment, (a) plan view, (b) B–B' sectioned view, and (c) C–C' sectioned view.

An ONO film 31 is entirely formed and further a polysilicon 25 is deposited before a resist is used to pattern the polysilicon 25 into a stripe-shape in a longitudinal direction with a slightly wider than a lateral length of the trench in a plan of FIG. 36(a), thereby forming a control gate 5. Subsequently, the exposed ONO film 31 is etched to etch the polysilicon 24 to adjust the width in lateral direction, so that as can be seen from FIGS. 36(b) and (c), floating gates 4 separated from each other are formed to finish the processes until FIG. 36. The control gate 5 in FIG. 36(c) is a stripe continuing in top and bottom directions in the drawing.

Figure 37:
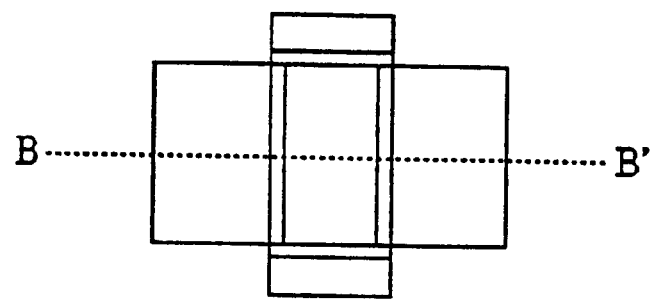
FIG. 37 is a view illustrative of a fabrication method in a third embodiment, (a) plan view, and (b) B–B' sectioned view.
Figure 37:
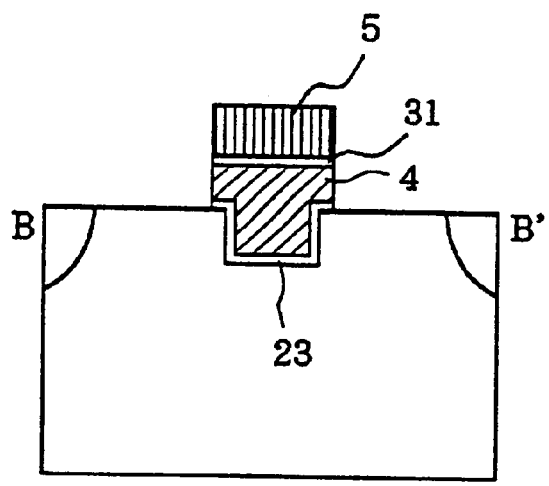

As shown in FIG. 37, the silicon oxide film exposed to the device formation region is removed to expose the substrate surfaces in opposite sides of the control gate as shown in FIG. 37(b).

Figure 38:
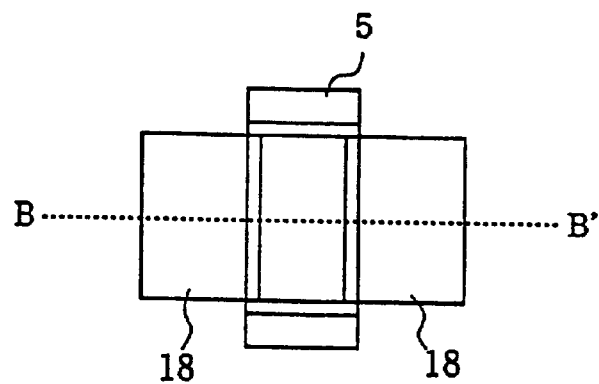
FIG. 38 is a view illustrative of a fabrication method in a third embodiment, (a) plan view, and (b) B–B' sectioned view.
Figure 38:
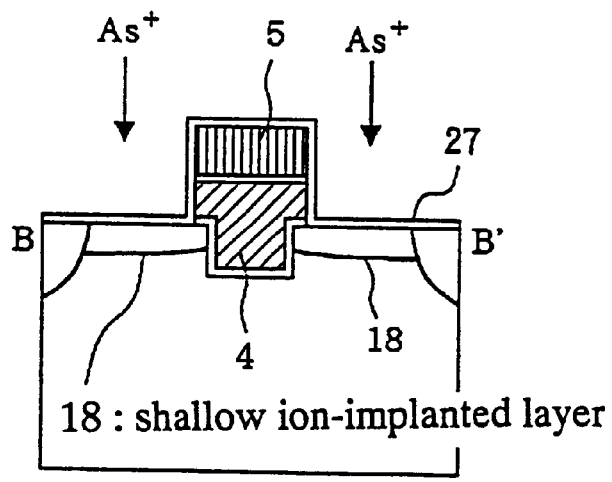

As shown in FIG. 38, on the surface, the dummy oxide film 27 (ion-implantation protection film) is formed for subsequent ion-implantation of arsenic with use of the control gate as a mask to form shallow ion-implanted layers 18. Ion-implantation conditions are that an acceleration energy is 10–40 keV and preferably 20–30 keV so that the diffusion layers does not reach the bottom of the trench 2 after a heat treatment for activation.

A dose is set about 1E15–5E15 cm-2.

Figure 39:
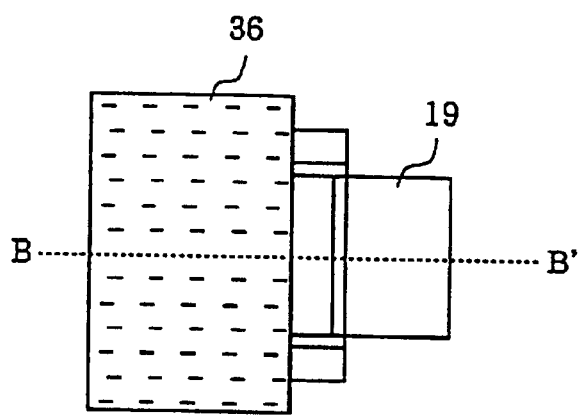
FIG. 39 is a view illustrative of a fabrication method in a third embodiment, (a) plan view, and (b) B–B' sectioned view.
Figure 39:
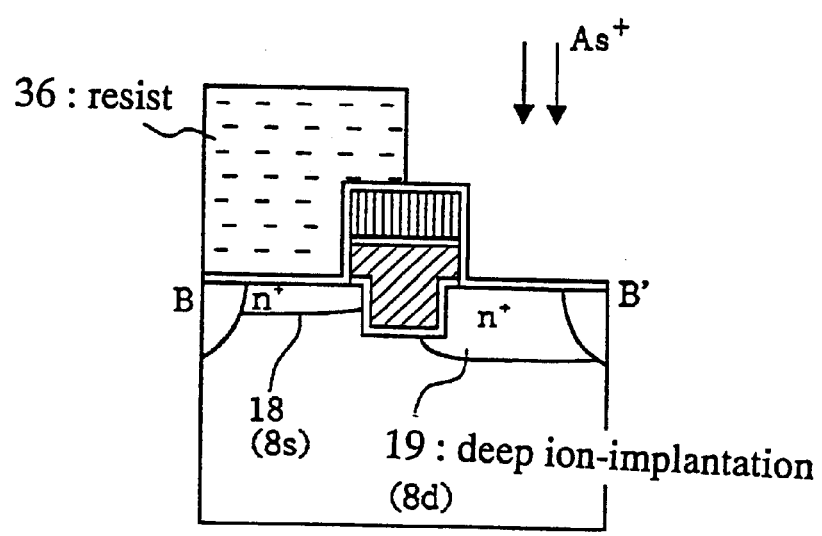

As shown in FIG. 39, a resist 36 is formed which covers a source region 8s of the shallow ion-implanted layers 18 and which has an opening over the drain region side. Arsenic is ion-implanted to form a deep ion diffusion layer 19 as a drain region 8d. Conditions for implantation are an acceleration energy is 40–100 keV and preferably 70–100 keV so that the diffusion layer reaches the bottom corner of the trench 2 after the heat treatment for activation. A dose is set about 1E15–5E15 cm-2.

Figure 40:
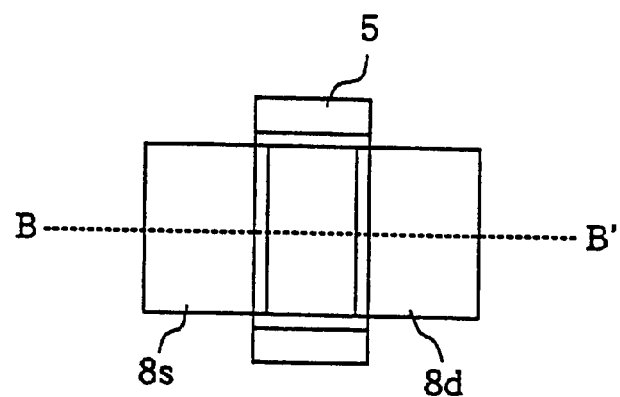
FIG. 40 is a view illustrative of a fabrication method in a third embodiment, (a) plan view, and (b) B–B' sectioned view.
Figure 40:
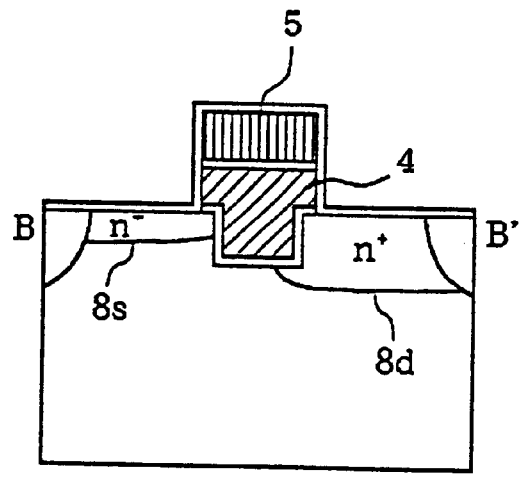

As shown in FIG. 40, the resist is removed. The memory cell structure of the flash memory is completed (FIG. 11 represents the same shape and see FIG. 11(a).

Fourth Embodiment

The flash memory with the structure in the above practicable mode 3 will be described.

Figure 41:
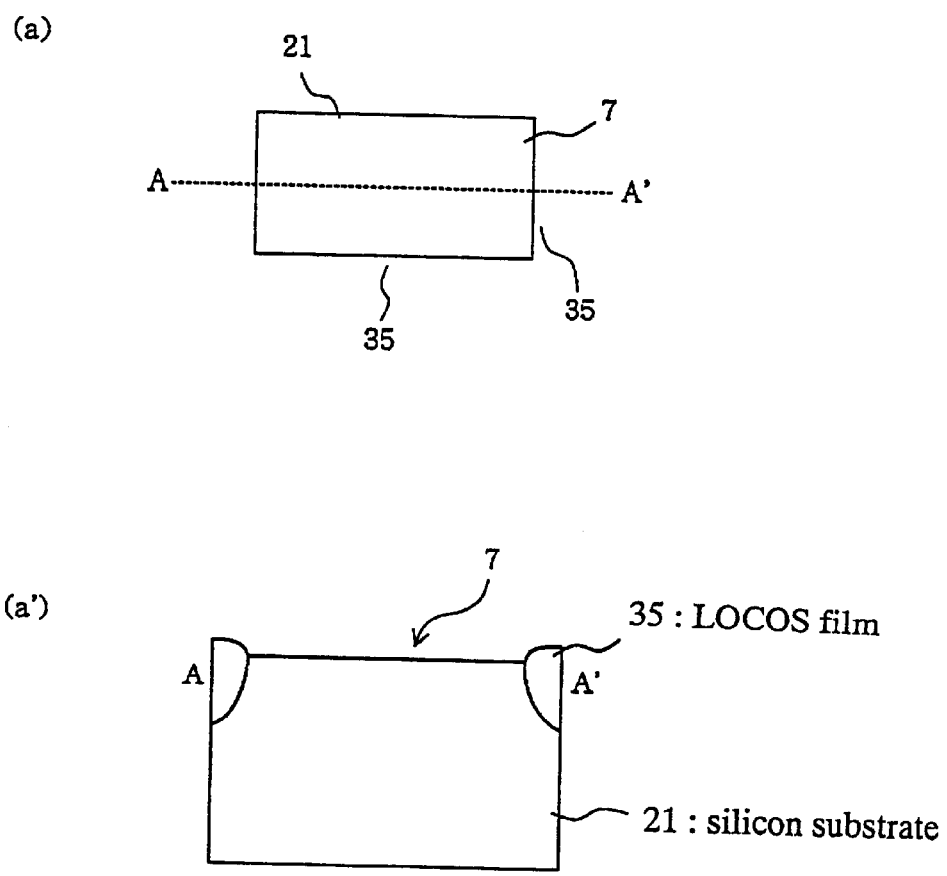
FIG. 41 is a view illustrative of a fabrication method in a fourth embodiment, (a) plan view, and (a') A–A' sectioned view.
Figure 42:
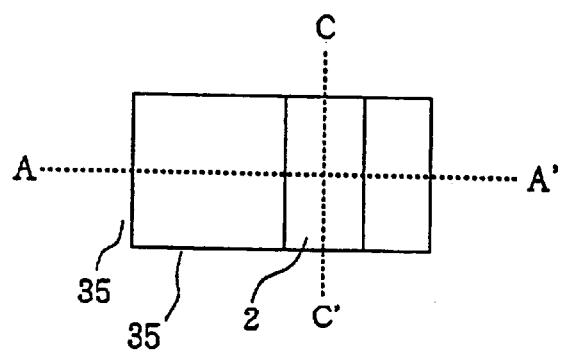
FIG. 42 is a view illustrative of a fabrication method in a fourth embodiment, (a) plan view, (a') A–A' sectioned view and (c) C–C' sectioned view.
Figure 42:
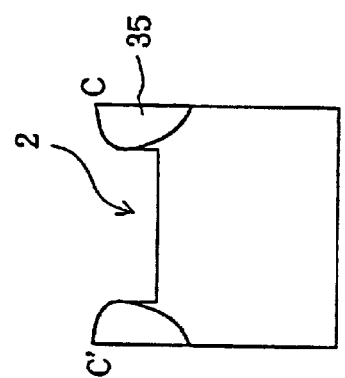
Figure 42:
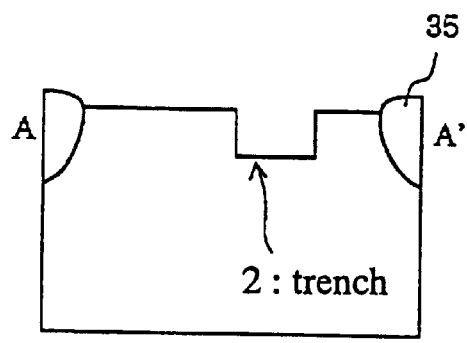

In this example, in FIGS. 41–45, the same processes are repeated in the same manner as in the third embodiment. Namely, a LOCOS film 35 is formed on an n-type silicon substrate 21 (FIG. 41). A trench 2 with a sectional shape of rectangle is formed with a dry etching (FIG. 42). As shown in FIG. 42, the position of the trench 2 is displaced to the right side from the center between the LOCOS films 35 to keep a space for providing a select gate after a source region is formed (in left side)

Figure 43:
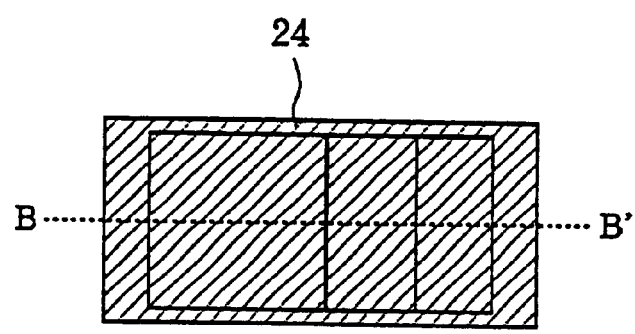
FIG. 43 is a view illustrative of a fabrication method in a fourth embodiment, (a) plan view, and (b) B–B' sectioned view.
Figure 43:
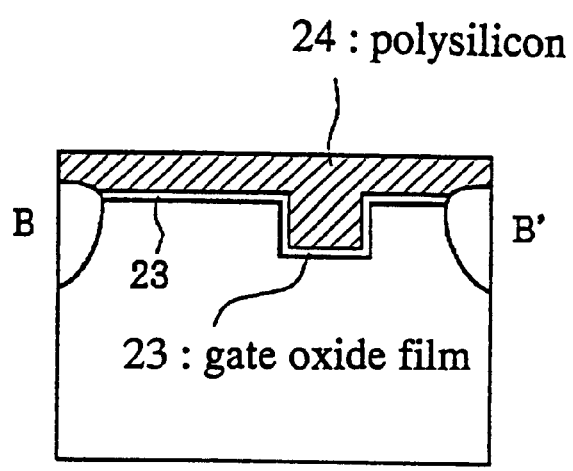
Figure 44:
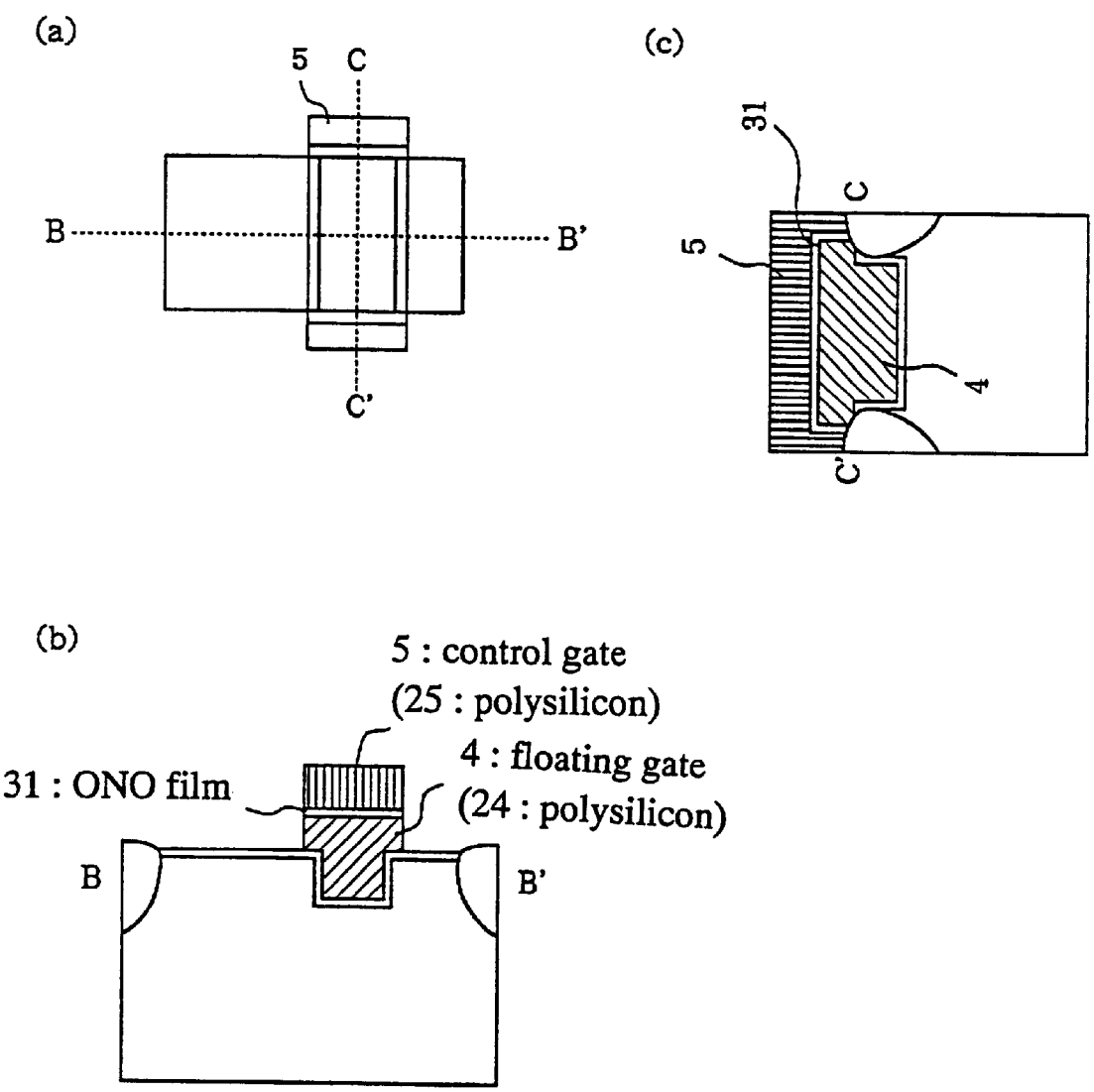
FIG. 44 is a view illustrative of a fabrication method in a fourth embodiment, (a) plan view, (b) B–B' sectioned view, and (c) C–C' sectioned view.
Figure 45:
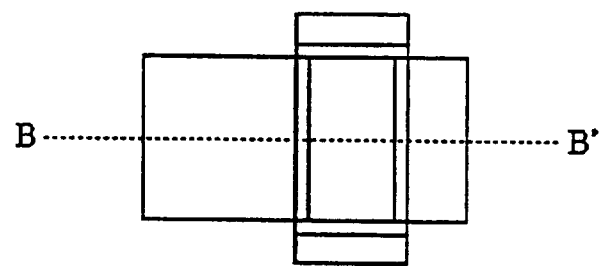
FIG. 45 is a view illustrative of a fabrication method in a fourth embodiment, (a) plan view, and (b) B–B' sectioned view.
Figure 45:
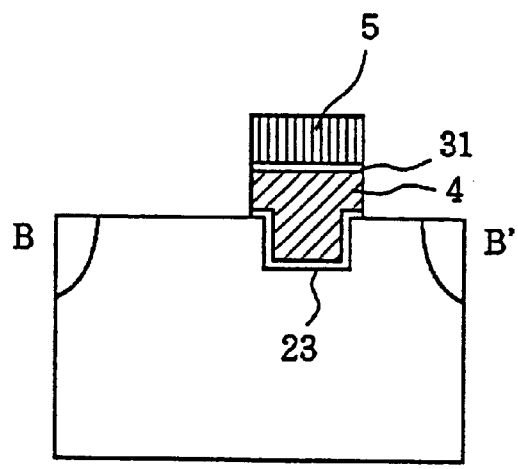

The polysilicon 24 is patterned in stripe shape in lateral direction to decide a width in longitudinal direction of the floating gate (FIG. 43). The ONO film 31 is formed before a polysilicon 25 is deposited and further patterned to form a control gate 5 with a stripe shape in a longitudinal direction. Further, the polysilicon 24 is etched to form floating gates 4 separated from each other (FIG. 44). As shown in FIG. 45, the exposed silicon oxide film is removed so that substrate surfaces are exposed in opposite sides of the control gate 5 as shown in FIG. 45(b).

Figure 46:
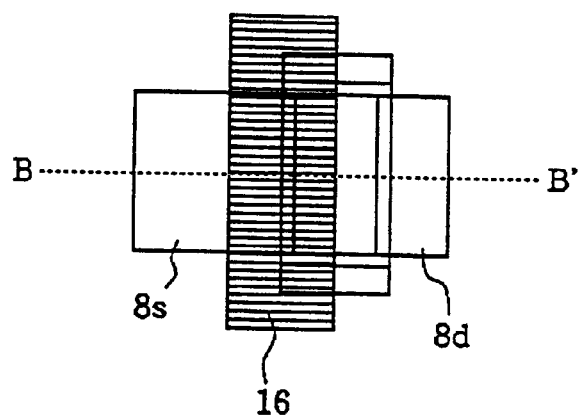
FIG. 46 is a view illustrative of a fabrication method in a fourth embodiment, (a) plan view, and (b) B–B' sectioned view.
Figure 46:
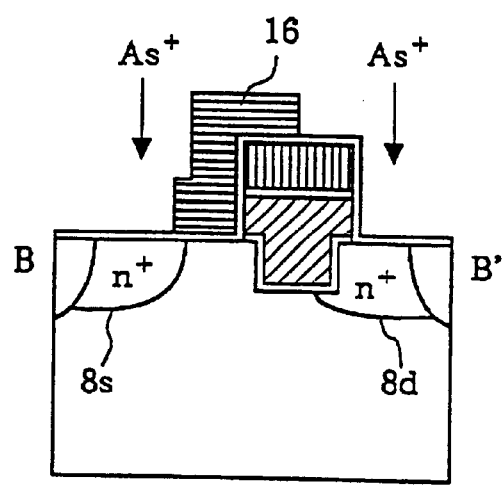
Figure 47:
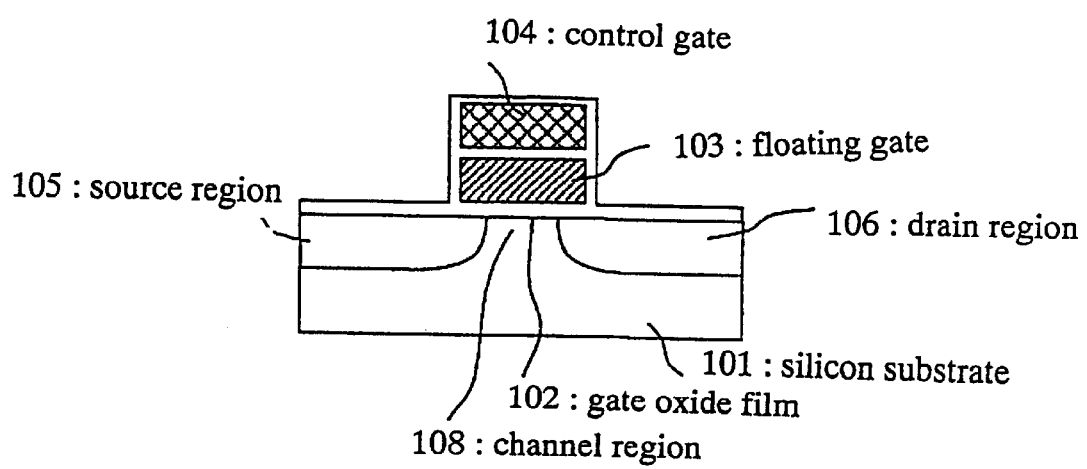
FIG. 47 is a view illustrative of a conventional flash memory.

In this embodiment, on the surface, the dummy oxide film 27 (as and ion-implantation protection film and also as an insulation film for insulating the select gate from the semiconductor substrate and the control gate) is formed before a polysilicon with 1500–2500 angstroms in thickness is deposited and then patterned to form a select gate 16 which covers a predetermined portion of the substrate surface in the source side as shown in FIG. 46. As in this drawing, the patterning is easy if the select gate overlaps a part of the control gate 5. Arsenic is ion-implanted to a deep position of the substrate to form a source region 8s and a drain region 8d. Ion implantation conditions are the same as in forming the deep ion-implanted layers in the third embodiment. (FIG. 15 represents the same shape and also see FIG. 15(a).

The memory cell structure of the flash memory is completed.

In accordance with the present invention, it is possible to provide a flash memory operable in low voltage and with a high reliability without reducing the thickness of the gate insulation film.

What is claimed:

1. A flash memory comprising:
   a semiconductor substrate;
   a trench extending into said semiconductor substrate, said trench having top and bottom corners;
   a gate insulation film within said trench and on a surface of the semiconductor substrate at the top corners of the trench, said gate insulation film having a first thickness in said trench and a second thickness on said surface;
   a floating gate buried within said trench and on said gate insulation film, said floating gate having top and bottom corners; and
   a control gate isolated from the floating gate,
      wherein at the bottom corners of the trench, the bottom corners of the floating gate face the semiconductor substrate; and
      wherein said second thickness of the gate insulation film prevents electron injections to the floating gate from the top corners of the trench.

2. The flash memory as claimed in claim 1, wherein the trench is stripe-shaped and extends in one direction across the semiconductor substrate surface,
   the control gate extends in the one direction over the trench,
   source and drain regions are in a direction perpendicular to the trench and on the semiconductor substrate surface so as to be common to plural memory cells, and
   the floating gate is under the control gate and between the source and drain regions.

3. The flash memory as claimed in claim 1, wherein the trench is stripe-shaped and extends in one direction across the semiconductor substrate surface,
   the control gate extends in a direction perpendicular to the trench,
   the floating gate is under the control gate and across the trench, and
   source and drain regions in the semiconductor substrate sandwich the floating gate so that the source region extends along the control gate so as to be common to plural memory cells.

4. A flash memory comprising:
   a semiconductor substrate;
   a trench extending into said semiconductor substrate, said trench having top and bottom corners;
   a gate insulation film within said trench;
   a floating gate buried within the trench and on the gate insulation film, said floating gate having top and bottom corners; and
   a control gate isolated from the floating gate by a control gate isolation film,
      wherein at the bottom corners of the trench, the bottom corners of the floating gate face the semiconductor substrate;
      wherein the floating gate is T-shaped with a wider portion than a trench width over the semiconductor substrate surface; and
      wherein a source region of a shallow impurity diffusion layer is in the semiconductor substrate on one side of the trench and a drain region of such a deep impurity diffusion layer as to reach the bottom corners of the trench is in the semiconductor substrate on an opposite side of the trench.

5. The flash memory as claimed in claim 4, wherein the surface of the semiconductor substrate is isolated by isolation films into a device formation region on which memory cells are formed,
   the trench divides the device formation region in plan view along the center of the device formation region, and the source and drain regions are provided at opposite sides of the trench,
   the floating gate buries the trench and is larger than the trench shape in plan view, and
   the control gate is over the trench and in the same direction as a direction along which the source and drain regions are divided.

6. The flash memory as claimed in claim 4, further comprising a select gate between the floating gate and the source region.

7. The flash memory as claimed in claim 6, wherein the surface of the semiconductor substrate is isolated by isolation films into a device formation region on which memory cells are formed,
   the trench divides the device formation region along the center of the device formation region, and the source and drain regions are provided at opposite sides of the trench, the floating gate buries the trench and is larger than the trench shape in plan view,
   the control gate is over the trench and in the same direction as a direction along which the source and drain regions are divided, and
   the select gate covers the semiconductor substrate surface between the floating gate and the source region and in the same direction as the control gate.

* * * * *